(12) United States Patent
Ide et al.

(10) Patent No.: US 8,809,414 B2
(45) Date of Patent: Aug. 19, 2014

(54) PHOTOCURABLE COMPOSITION AND CURED PRODUCT

(75) Inventors: Masahito Ide, Settsu (JP); Takao Manabe, Settsu (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 13/121,994

(22) PCT Filed: Sep. 30, 2009

(86) PCT No.: PCT/JP2009/067010
§ 371 (c)(1),
(2), (4) Date: Jun. 7, 2011

(87) PCT Pub. No.: WO2010/038767
PCT Pub. Date: Apr. 8, 2010

(65) Prior Publication Data
US 2011/0237702 A1    Sep. 29, 2011

(30) Foreign Application Priority Data

Oct. 2, 2008    (JP) .................. 2008-257771

(51) Int. Cl.
*C08F 283/12* (2006.01)
*C08F 2/46* (2006.01)
*C08J 3/28* (2006.01)

(52) U.S. Cl.
USPC ........................................... 522/99; 522/148

(58) Field of Classification Search
USPC ................................................ 522/1, 99, 148
See application file for complete search history.

(56) References Cited

U.S. PATENT DOCUMENTS

| | | | |
|---|---|---|---|
| 4,640,967 A * | 2/1987 | Eckberg ...................... | 528/26 |
| 4,943,601 A | 7/1990 | Dinallo, Sr. | |
| 4,987,158 A | 1/1991 | Eckberg | |
| 5,037,861 A | 8/1991 | Crivello et al. | |
| 5,198,520 A | 3/1993 | Onishi et al. | |
| 5,204,408 A | 4/1993 | Konno et al. | |
| 5,240,971 A * | 8/1993 | Eckberg et al. ................. | 522/31 |
| 5,268,396 A * | 12/1993 | Lai ................................. | 522/28 |
| 5,296,298 A | 3/1994 | Fujimoto et al. | |
| 5,391,678 A | 2/1995 | Bard et al. | |
| 5,409,995 A | 4/1995 | Iwahara et al. | |
| 5,523,374 A | 6/1996 | Bard et al. | |
| 5,580,925 A | 12/1996 | Iwahara et al. | |
| 5,684,110 A | 11/1997 | Kawamura | |
| 5,721,291 A * | 2/1998 | Gaulle et al. ..................... | 522/38 |
| 6,187,890 B1 | 2/2001 | Fehn et al. | |
| 6,355,946 B1 | 3/2002 | Ishinaga | |
| 6,592,999 B1 | 7/2003 | Anderson et al. | |
| 6,791,259 B1 | 9/2004 | Stokes et al. | |
| 7,371,462 B2 * | 5/2008 | Tsumura et al. ............. | 428/447 |
| 7,785,715 B2 | 8/2010 | Tsumura et al. | |
| 2002/0156186 A1 | 10/2002 | Bublewitz et al. | |
| 2003/0144420 A1 | 7/2003 | Tsumura et al. | |
| 2003/0232222 A1 | 12/2003 | Anderson et al. | |
| 2004/0126504 A1 | 7/2004 | Ouchi et al. | |
| 2005/0042463 A1 | 2/2005 | Anderson et al. | |
| 2005/0171318 A1 * | 8/2005 | Okuhira et al. ................. | 528/34 |
| 2005/0209400 A1 | 9/2005 | Tsumura et al. | |
| 2009/0162782 A1 | 6/2009 | Takei et al. | |
| 2010/0222525 A1 * | 9/2010 | Ichiryu et al. ................ | 525/476 |

FOREIGN PATENT DOCUMENTS

| | | |
|---|---|---|
| CN | 1649964 A | 8/2005 |
| EP | 0 803 529 A1 | 10/1997 |
| EP | 1 369 458 A1 | 12/2003 |
| EP | 1 505 121 A1 | 2/2005 |
| EP | 1 505 121 A1 | 9/2005 |
| JP | 48-48500 A | 5/1973 |
| JP | 50-100 | 1/1975 |
| JP | 59-155483 A | 9/1984 |
| JP | 61-118746 A | 6/1986 |
| JP | 62-20733 A | 1/1987 |
| JP | 62-207333 A | 9/1987 |
| JP | 3-14838 A | 1/1991 |
| JP | 3-247686 A | 11/1991 |
| JP | 4-218051 A | 8/1992 |
| JP | 4-222817 A | 8/1992 |
| JP | 5-140459 A | 6/1993 |
| JP | 6-263989 A | 9/1994 |
| JP | 8-157720 A | 6/1996 |
| JP | 8-183934 A | 7/1996 |

(Continued)

OTHER PUBLICATIONS

Translation of International Preliminary Report on Patentability ( Forms PCT/IB/373) of International Application No. PCT/JP2009/067010 issued date May 10, 201 with Form PCT/ISA/237.

(Continued)

*Primary Examiner* — Ling Choi
*Assistant Examiner* — Jessica E Whiteley
(74) *Attorney, Agent, or Firm* — Westerman, Hattori, Daniels & Adrian, LLP

(57) ABSTRACT

It is an object of the present invention to provide: a curable composition that has photocurability and provides a cured product excellent in insulating properties; and the cured product. This can be achieved by a photocurable composition that contains, as essential components, (A) a modified polyorganosiloxane compound having a photopolymerizable functional group and an SiH group, (B) a compound having a carbon-carbon double bond, and (C) a photopolymerization initiator. A thin film produced from the curable composition of the present invention has excellent insulating properties. Since the curable composition of the present invention can form a film by solution coating, it is applicable to provide thin-film insulating materials that can be formed by solution coating.

14 Claims, No Drawings

(56) References Cited

FOREIGN PATENT DOCUMENTS

| | | |
|---|---|---|
| JP | 9-291214 A | 11/1997 |
| JP | 9-316293 A | 12/1997 |
| JP | 10-3270 A | 1/1998 |
| JP | 2000-124475 A | 4/2000 |
| JP | 2000-183407 A | 6/2000 |
| JP | 2000-344895 A | 12/2000 |
| JP | 2001-011210 A | 1/2001 |
| JP | 2001-118865 A | 4/2001 |
| JP | 2001-207059 A | 7/2001 |
| JP | 2001-513117 A | 8/2001 |
| JP | 3203843 B2 | 8/2001 |
| JP | 2002-80733 A | 3/2002 |
| JP | 2002-194215 A | 7/2002 |
| JP | 2002-217459 A | 8/2002 |
| JP | 2002-235005 A | 8/2002 |
| JP | 2002-314140 A | 10/2002 |
| JP | 2002-317048 A | 10/2002 |
| JP | 2002-317408 A | 10/2002 |
| JP | 2002-324920 A | 11/2002 |
| JP | 2002-338833 A | 11/2002 |
| JP | 3354973 B2 | 12/2002 |
| JP | 2003-113310 A | 4/2003 |
| JP | 2003-128921 A | 5/2003 |
| JP | 2003-261770 A | 9/2003 |
| JP | 2003-261783 A | 9/2003 |
| JP | 2003-268239 A | 9/2003 |
| JP | 2004-002783 * | 1/2004 |
| JP | 2004-002783 A | 1/2004 |
| JP | 2004-143449 A | 5/2004 |
| JP | 2004-196958 A | 7/2004 |
| JP | 2004-212983 A | 7/2004 |
| JP | 2004-349319 A | 12/2004 |
| JP | 2004-359933 A | 12/2004 |
| JP | 2005-023256 A | 1/2005 |
| JP | 2005-266673 A | 9/2005 |
| JP | 2006-8740 A | 1/2006 |
| JP | 2006 241462 A | 9/2006 |
| JP | 2006-269402 A | 10/2006 |
| JP | 2006-291044 A | 10/2006 |
| JP | 2007-043055 A | 2/2007 |
| JP | 2007-158147 A | 6/2007 |
| JP | 2007-258663 A | 10/2007 |
| JP | 2007-293160 A | 11/2007 |
| JP | 2008-274004 A | 11/2008 |
| JP | 2008-291137 A | 12/2008 |
| JP | 2009-062490 A | 3/2009 |
| JP | 4611617 B2 | 1/2011 |
| JP | 4685690 B2 | 5/2011 |
| JP | 4694371 B2 | 6/2011 |
| JP | 5117799 B2 | 1/2013 |
| TW | 200724825 A | 9/2007 |
| WO | 01/81475 A1 | 11/2001 |
| WO | 02/053648 A1 | 11/2002 |
| WO | 03/091338 A1 | 6/2003 |
| WO | 03/091338 A1 | 11/2003 |
| WO | 2007/074813 A1 | 7/2007 |
| WO | 2007097212 A1 | 8/2007 |
| WO | WO 2007/074813 * | 12/2007 |
| WO | 2008/010545 A1 | 1/2008 |
| WO | 2008/133138 A1 | 11/2008 |
| WO | 2009/075233 A1 | 6/2009 |

OTHER PUBLICATIONS

International Search Report of PCT/JP2009/067010, mailing date Dec. 15, 2009.
English translation of International Preliminary Report on Patentability (form PCT/IB/373) of PCT/JP2008/072181 dated Jun. 15, 2010 with form PCT/ISA/237 (9 pages).
George Wypych, Handbook of Fillers, 2000, ChemTec, 2nd Edition, p. 246.
International Preliminary Report on Patentability (Form PCT/IB/373) of International Application No. PCT/JP2004/002199, ussued date Mar. 2, 2006 with PCT/ISA/237.
International Search Report dated Jun. 1, 2004, issued in corresponding appilcation No. PCT/JP2004/002199.
"Fira Handbook", Edited by the Society of Rubber Industry, Japan Gomu Kogyo Gijutsu linkai et al., Taisei-sha Kabushiki Kaisha, 1987, pp. 198 to 218 (with partial English translation).
Kiyono Manabu, "Sanka Titanium Bussei to Oyo Gijutsu" Gihodo Shuppan Co., Ltd., 1991, pp. 75-155 (with partial English translation).
Salamone, J.C., "Polymeric Materials Encyclopedia", vol. 7, Jul. 1996, CRC, 1st Edition, p. 1322.

\* cited by examiner

PHOTOCURABLE COMPOSITION AND CURED PRODUCT

TECHNICAL FIELD

The present invention relates to a photocurable composition that provides a cured product excellent in optical transparency and insulating properties.

BACKGROUND ART

Epoxy silicon compounds obtained by reacting an alkenyl compound having an epoxy group with a siloxane compound have been conventionally known to serve as a UV curable resin in the presence of a photocationic polymerization initiator (Patent Document 1). However, these compounds have room for further improvement in terms of leakage current when used in applications such as insulators of electric elements (Patent Document 3).

A technique relating to a curable composition obtained by hydrosilylation of an SiH group-containing siloxane compound that is partially substituted by an epoxy group and a polyene compound has already been known. However, the curable composition does not serve as a photocurable resin, and naturally has not been able to be employed for fine patterning by lithography (Patent Document 2).

Patent Document 1: U.S. Pat. No. 5,037,861
Patent Document 2: Japanese Kokai Publication H06-263989
Patent Document 3: Japanese Kokai Publication 2006-291044

SUMMARY OF THE INVENTION

With the foregoing in view, it is an object of the present invention to provide a curable composition that has photocurability, is preferably applicable to lithography, and provides a cured product excellent in insulating properties; and the cured product.

As a result of intensive investigations made by the present inventors to solve the problems mentioned above, the present inventors have found that the problems can be solved by photocuring a curable composition that contains, as essential components, a modified polyorganosiloxane compound having a photopolymerizable functional group and an SiH group within the same molecule; a compound having a carbon-carbon double bond; and a photopolymerization initiator, followed by post-curing by heating. Thus, the present inventors have completed the present invention.

The present invention has the following features.

1) A photocurable composition comprising:
(A) a modified polyorganosiloxane compound having a photopolymerizable functional group and an SiH group;
(B) a compound having a carbon-carbon double bond; and
(C) a photopolymerization initiator.

2) The curable composition according to 1),
wherein the photopolymerizable functional group in the component (A) is at least one member selected from the group consisting of an epoxy group, a crosslinkable silicon group, a (meth)acryloyl group, and an oxetanyl group.

3) The curable composition according to 1),
wherein at least one of the photopolymerizable functional group in the component (A) is an alicyclic epoxy group or a glycidyl group.

4) The curable composition according to 1) or 2),
wherein at least one of the photopolymerizable functional group in the component (A) is an alkoxysilyl group.

5) The curable composition according to any one of 1) to 4),
wherein the component (B) is a compound represented by the following general formula (I):

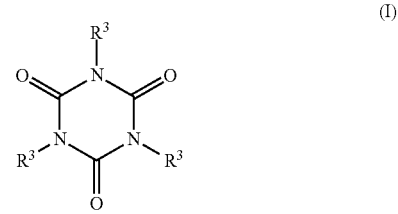

wherein, $R^3$s each represent a $C_{1-50}$ monovalent organic group, and may be the same as or different from each other, and at least one $R^3$ contains a carbon-carbon double bond having reactivity with SiH groups.

6) The curable composition according to any one of 1) to 5),
wherein the component (B) is a compound having an Si—CH=CH$_2$ group.

7) The curable composition according to any one of 1) to 6),
wherein the component (A) is a modified polyorganosiloxane compound having a photopolymerizable functionl group, an SiH group, and at least one member selected from the group consisting of moieties represented by the following formulas (X1) to (X3), a phenolic hydroxyl group, and a carboxyl group.

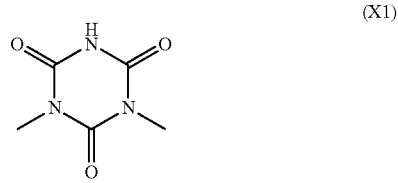

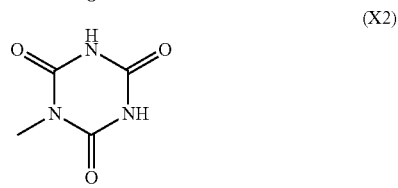

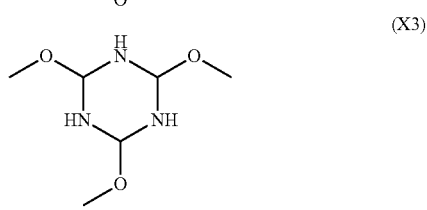

8) The curable composition according to any one of 1) to 7),
wherein the component (A) is a hydrosilylation reaction product of the following compounds (α) to (γ):
(α) an organic compound having, in a molecule thereof, one or more carbon-carbon double bonds that have reactivity with SiH groups;
(β) an organosiloxane compound having at least two SiH groups in a molecule thereof; and (γ) a compound having, in a molecule thereof, a photopolymerizable functional group and a carbon-carbon double bond that has reactivity with SiH groups.

9) The curable composition according to 8),
wherein the compound (α) is a compound having one or more carbon-carbon double bonds that have reactivity with SiH groups, and represented by the following general formula (I):

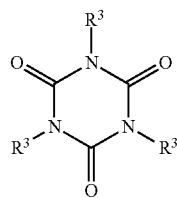

(I)

wherein, $R^3$s each represent a $C_{1-50}$ monovalent organic group, and may be the same as or different from each other, and at least one $R^3$ contains a carbon-carbon double bond having reactivity with SiH groups.

10) The curable composition according to 8) or 9),
wherein the compound (α) is a compound having an Si—CH=CH$_2$ group.

11) The curable composition according to any one of 8) to 10),
wherein the compound (α) is an organic compound that has, in a molecule thereof, one or more carbon-carbon double bonds having reactivity with SiH groups, and has, within the same molecule, at least one member selected from the group consisting of moieties represented by the following formulas (X1) to (X3), a phenolic hydroxyl group, and an carboxyl group.

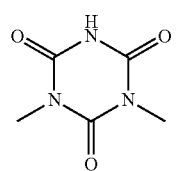

(X1)

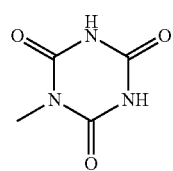

(X2)

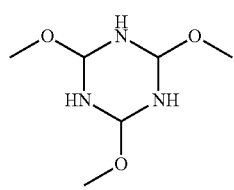

(X3)

12) The curable composition according to any one of 8) to 11),
wherein the compound (β) is a cyclic polyorganosiloxane compound having SiH groups, represented by the following general formula (III):

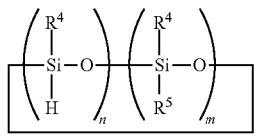

(III)

wherein, $R^4$ and $R^5$ each represent a $C_{1-10}$ organic group and may be the same or different, n represents a number of 1 to 10, and m represents a number of 0 to 10.

13) The curable composition according to any one of 8) to 12),
wherein the compound (γ) is a compound represented by the following general formula (IV):

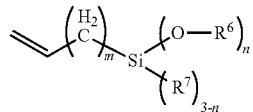

(IV)

wherein, $R^6$ and $R^7$ each represent a $C_{1-6}$ organic group, n represents a number of 1 to 3, and m represents a number of 0 to 10.

14) A cured product obtained by curing the curable composition according to any one of 1) to 13).

According to the present invention, the curable composition has photocurability and provides a cured product excellent in transparency and insulating properties.

BEST MODE FOR CARRYING OUT THE INVENTION (Component A)

There are no particular limitations on the modified polyorganosiloxane compound to be used in the curable composition of the present invention, provided it has, in a molecule thereof, at least two photopolymerizable functional groups and at least one SiH group.

There are no particular limitations on the structure of the modified polyorganosiloxane compound which, herein, is meant a compound or polymer that has a siloxane unit (Si—O—Si) and an organic group X including C, H, N, O, and/or S as an constituent element thereof. Among siloxane units present in the compound, the higher the proportion of T unit ($XSiO_{3/2}$) or Q unit ($SiO_{4/2}$) to the constituents, the higher the hardness and the better the heat-resistant reliability of the resulting cured product, while the higher the proportion of M unit ($X_3SiO_{1/2}$) or D unit ($X_2SiO_{2/2}$), the greater the flexibility and the lower the stress of the cured product.

The photopolymerizable functional group, as used herein, refers to a functional group that undergoes polymerization or crosslinking by a radical or cation species generated from a photopolymerization initiator when subjected to light energy from the outside, and there are no particular limitations on the type of reaction or crosslinking.

From the viewpoints of reactivity and compound stability in particular, at least one photopolymerizable functional group is preferably an epoxy group, a crosslinkable silicon group, a (meth)acryloyl group, an oxetanyl group and/or a vinyloxy group.

Among epoxy groups, from the viewpoint of stability, an alicyclic epoxy group and a glycidyl group are preferable. An alicyclic epoxy group is particularly preferable with respect to its superior cationic polymerizabilities by light and heat.

Examples of the crosslinkable silicon group include hydrolyzable silicon groups such as an alkoxysilyl group, an acetoxysilyl group, a phenoxysilyl group, a silanol group and a chlorosilyl group. From the viewpoints of availability and compound stability in particular, an alkoxysilyl group is particularly preferable.

Examples of the alkoxysilyl group include those in which the functional group bonded to silicon is a methoxy group, ethoxy group, n-propoxy group, iso-propoxy group, n-butoxy group, sec-butoxy group or tert-butoxy group. From the viewpoint of less likelihood of residual components remaining after curing, a methoxy group and an ethoxy group are particularly preferable, and a methoxy group is most preferable. The modified polyorganosiloxane compound may have at least two photopolymerizable functional groups, and the photopolymerizable functional groups may be the same, or the modified polyorganosiloxane compound may have two or more different functional groups.

Although the modified polyorganosiloxane compound contained in the curable composition of the present invention may have at least two photopolymerizable functional groups in a molecule thereof, it preferably has three or more, and more preferably five or more, photopolymerizable functional groups. If it has three or more such groups, there is the advantage of allowing the obtaining of a cured product having a high crosslinking density and superior heat resistance.

The component (A) of the present invention can be dissolved in an aqueous alkali solution and can provide an industrially useful curable composition having lithographic properties as a result of preferably having at least one member selected from the group consisting of moieties represented by the following formulas (X1) to (X3):

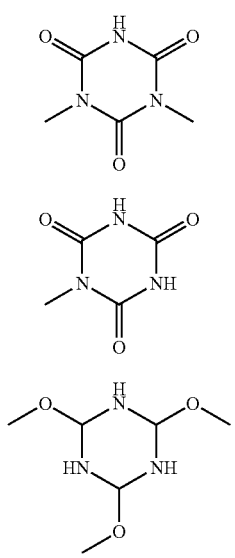

and a phenolic hydroxyl group and a carboxyl group (hereinafter, "the moieties represented by the above-mentioned formulas (X1) to (X3), a phenolic hydroxyl group and a carboxyl group" may be referred to as "acidic groups") within the same molecule.

From the viewpoint of the resulting cured product demonstrating a little coloring at high temperatures, a carboxyl group and the moieties represented by the below-mentioned formulas among these organic structures are preferable.

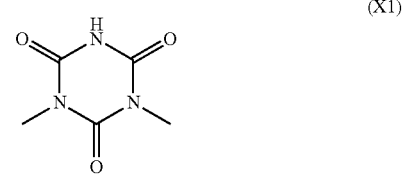

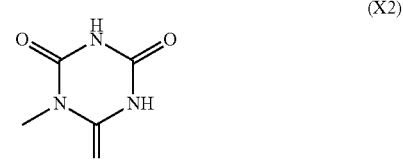

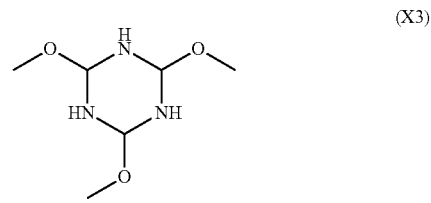

From the additional viewpoint of allowing the obtaining of a cured product having a low degree of thermal decomposition at high temperatures, a component (A) having each of the moieties represented by the following formulas is particularly preferable.

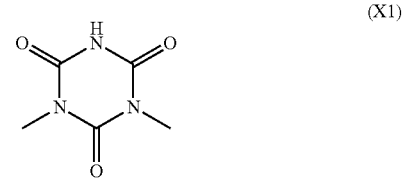

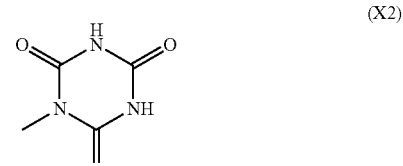

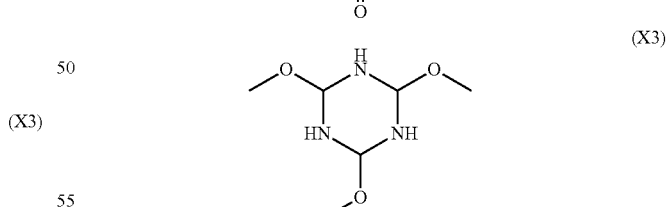

(Component B)

There are no particular limitations on the component B provided it can be used for the curable composition of the present invention and has at least one carbon-carbon double bond in a molecule thereof. Such a compound can be used without any particular limitations whether it is a polysiloxane compound or an organic compound.

From the viewpoints of transparency and curability of the resulting cured product in particular, polysiloxanes having an alkenyl group can be preferably applied. Among these, polysiloxane compounds having a vinyl group bonded to a silicon group (i.e., Si—CH=CH₂ group) are preferable from the viewpoint of availability of compounds.

Specific examples of the polysiloxane compounds include poly- or oligosiloxanes in which an end thereof is blocked with a dimethylvinylsilyl group, poly- or oligosiloxanes having a vinyl group in a side chain thereof, tetramethyldivinyldisiloxane, hexamethyltrivinyltrisiloxane, and those in which a hydrogen atom of an SiH group of the exemplary cyclic siloxanes having an SiH group is substituted with an alkenyl group such as a vinyl group or allyl group.

More specifically, examples thereof include compounds such as 1,3,5,7-vinyl-1,3,5,7-tetramethylcyclotetrasiloxane, 1-propyl-3,5,7-trivinyl-1,3,5,7-tetramethylcyclotetrasiloxane, 1,5-divinyl-3,7-dihexyl-1,3,5,7-tetramethylcyclotetrasiloxane, 1,3,5-trivinyl-1,3,5-trimethylcyclosiloxane, 1,3,5,7,9-pentavinyl-1,3,5,7,9-pentamethylcyclosiloxane, and 1,3,5,7,9,11-hexavinyl-1,3,5,7,9,11-hexamethylcyclosiloxane.

There are no particular limitations on the alkenyl group-containing organic compound provided it is not that which contains a siloxane unit (Si—O—Si), but is that which contains, as constituent elements thereof, atoms selected from the group consisting of C, H, N, O, S and halogens, and contains, in a molecule thereof, at least one carbon-carbon double bond having reactivity with SiH groups. There are no particular limitations on the location of the carbon-carbon double bond having reactivity with SiH groups, and it may be present anywhere within the molecule.

Such organic compounds can be classified into organic polymer compounds and organic monomer compounds. Examples of organic polymer compounds that can be used include polyether, polyester, polyallylate, polycarbonate, saturated hydrocarbon, unsaturated hydrocarbon, polyacrylic acid ester, polyamide, phenol-formaldehyde (or phenol resin) and polyimide compounds.

Examples of the organic monomer compounds include aromatic hydrocarbon compounds such as phenol series, bisphenol series, benzene, and naphthalene; aliphatic hydrocarbon compounds such as linear or alicyclic ones; and heterocyclic compounds; and mixtures thereof.

Specific examples of the organic monomer compounds include diallyl phthalate, triallyl trimellitate, diethylene glycol bis(allyl carbonate), trimethylolpropane diallyl ether, trimethylolpropane triallyl ether, pentaerythritol triallyl ether, pentaerythritol tetraallyl ether, 1,1,2,2-tetraallyloxyethane, diallylidene pentaerythritol, triallyl cyanurate, 1,2,4-trivinylcyclohexane, 1,4-butanediol diallyl ether, nonanediol diallyl ether, 1,4-cyclohexanedimethanol diallyl ether, triethylene glycol diallyl ether, trimethylolpropane trivinyl ether, pentaerythritol tetravinyl ether, diallyl ether of bisphenol S, divinylbenzene, divinylbiphenyl, 1,3-diisopropenylbenzene, 1,4-diisopropenylbenzene, 1,3-bis(allyloxy)adamantane, 1,3-bis(vinyloxy)adamantane, 1,3,5-tris(allyloxy)adamantane, 1,3,5-tris(vinyloxy)adamantane, dicyclopentadiene, vinylcyclohexene, 1,5-hexadiene, 1,9-decadiene, diallyl ether, bisphenol A diallyl ether, 2,5-diallylphenol allyl ether, and oligomers thereof, 1,2-polybutadiene (1,2-content of 10 to 100%, preferably 1,2-content of 50 to 100%), allyl ether of phenol novolak, allylated polyphenylene oxide, and other compounds obtained by replacing all glycidyl groups of a conventionally known epoxy resin with allyl groups.

As the organic compound, low molecular weight compounds, which are difficult to be characterized by the separate viewpoints of a backbone moiety and an alkenyl group (carbon-carbon double bond having reactivity with SiH groups), can also be used. Specific examples of these low molecular weight compounds include aliphatic acyclic polyene compounds such as butadiene, isoprene, octadiene and decadiene; aliphatic cyclic polyene compounds such as cyclopentadiene, cyclohexadiene, cyclooctadiene, dicyclopentadiene, tricyclopentadiene and norbornadiene; and substituted aliphatic cyclic olefin compounds such as vinylcyclopentene and vinylcyclohexene.

Triallyl isocyanurate represented by the following general formula (I) and its derivatives are particularly preferable from the viewpoints of high transparency, high heat resistance and high light resistance. Preferable are compounds represented by the following general formula (I):

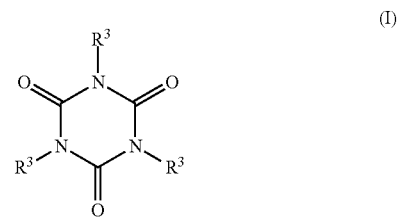

wherein, $R^3$s each represent a $C_{1-50}$ monovalent organic group, and may be the same as or different from each other, and at least one $R^3$ contains a carbon-carbon double bond having reactivity with SiH groups.

As $R^3$ in the formula (I), $C_{1-20}$ monovalent organic groups are preferable, $C_{1-10}$ monovalent organic groups are more preferable, and $C_{1-4}$ monovalent organic groups are even more preferable, from the viewpoint that the resulting cured product may have even higher heat resistance. Preferable examples of these $R^3$s include methyl, ethyl, propyl, butyl, phenyl, benzyl, phenethyl, vinyl and allyl groups.

Specific examples of these compounds include triallyl isocyanurate, diallyl isocyanurate, diallyl monoglycidyl isocyanurate, diallyl monobenzyl isocyanurate, and diallyl monopropyl isocyanurate, and particularly include triallyl isocyanurate from the viewpoint of availability.

(Component C)

The curable composition of the present invention contains a photopolymerization initiator as an essential component. It is necessary to selectively add a particular photopolymerization initiator depending on the kind of photopolymerizable functional group. In the case where the functional group is an epoxy group, an alkoxysilyl group, or the like, a cationic polymerization initiator is used. In the case where the functional group is a radical polymerizable group such as an allyloxy group or a methacryloxy group, a photoradical initiator is used.

(Cationic Polymerization Initiator)

There are no particular limitations on the cationic polymerization initiator provided it is an active energy beam cationic polymerization initiator, which generates a cationic species or Lewis acid due to an active energy beam, or a thermal cationic polymerization initiator, which generates a cationic species or Lewis acid due to heat.

The active energy beam cationic polymerization initiator include one or more types of: metal-fluoroboron complex salts and boron trifluoride complex compounds as described in U.S. Pat. No. 3,379,653; bis(perfluoroalkylsulfonyl)methane metal salts as described in U.S. Pat. No. 3,586,616; aryldiazonium compounds as described in U.S. Pat. No. 3,708,296; aromatic onium salts of group VIa elements as described in U.S. Pat. No. 4,058,400; aromatic onium salts of group Va elements as described in U.S. Pat. No. 4,069,055; dicarbonyl chelates of group IIIa to group Va elements as described in U.S. Pat. No. 4,068,091; thiopyrylium salts as described in U.S. Pat. No. 4,139,655; group VIa elements in the form of $MF^{6-}$ anion (wherein, M is selected from phosphorus, antimony and arsenic) as described in U.S. Pat. No. 4,161,478; aryl sulfonium complex salts as described in U.S. Pat. No. 4,231,951; aromatic iodonium complex salts and aromatic sulfonium complex salts as described in U.S. Pat. No. 4,256,828; bis[4-(diphenylsulfonio)phenyl]sulfide-bis-hexafluoro metal salts (such as phosphates, arsenates and antimonates) as described by W. R. Watt et al. in "Journal of Polymer Science—Polymer Chemistry Edition", Vol. 22, p. 1789 (1984); and aromatic iodonium complex salts and aromatic sulfonium complex salts in which the anion is $B(C_6F_5)_4^-$.

Preferable examples of cation-type active energy beam cationic polymerization initiators include aryl sulfonium complex salts, aromatic sulfonium or iodonium salts of halogen-containing complex ions, and aromatic onium salts of group II, V and VI elements. Several of these salts are available as commercial products of FX-512 (3M), UVR-6990 and UVR-6974 (Union Carbide), UVE-1014 and UVE-1016 (General Electric), KI-85 (Degussa), SP-152 and SP-172 (Asahi Denka), San-Aid SI-60L, SI-80L and SI-100L (Sanshin Chemical Industry), WPI113 and WPI116 (Wako Pure Chemical Industries) and Rhodorsil PI2074 (Rhodia).

The amount of cationic polymerization initiator used is preferably 0.01 to 10 parts by weight and more preferably 0.1 to 5 parts by weight relative to 100 parts by weight of the modified polyorganosiloxane compound. If the amount of cationic polymerization initiator is excessively low, a long time is required for curing or an adequately cured product is not obtained. If the amount of the initiator is excessively high, the color of the initiator remains in the cured product, coloring or protrusions occur due to too rapid curing, or heat resistance and light resistance of the cured product are impaired, thereby resulting in undesirable effects.

(Radical Polymerization Initiator)

A radical polymerization initiator can be used without any particular limitations provided it is an active energy beam radical polymerization initiator which generates a radical species due to an active energy beam.

Examples of the active energy beam radical polymerization initiator include acetophenone compounds, benzophenone compounds, acylphosphine oxide compounds, oxime ester compounds, benzoin compounds, biimidazole compounds, α-diketone compounds, titanocene compounds, polynuclear quinone compounds, xanthone compounds, thioxanthone compounds, triazine compounds, ketal compounds, azo compounds, peroxides, 2,3-dialkyldione compounds, disulfide compounds, thiuram compounds and fluoroamine compounds.

Specific examples of the acetophenone compounds include 1-(4-dodecylphenyl)-2-hydroxy-2-methylpropan-1-one, 2,2-dimethoxy-2-phenylacetophenone, 2-hydroxy-2-methyl-1-phenylpropan-1-one, 1-(4'-i-propylphenyl)-2-hydroxy-2-methylpropan-1-one, 4-(2'-hydroxyethoxy)phenyl(2-hydroxy-2-propyl)ketone, 2,2-dimethoxyacetophenone, 2,2-diethoxyacetophenone, 2-methyl-1-(4'-methylthiophenyl)-2-morpholinopropan-1-one, 2-benzyl-2-dimethylamino-1-(4'-morpholinophenyl)butan-1-one, 1-hydroxycyclohexyl phenyl ketone, 2,2-dimethoxy-1,2-diphenylethan-1-one, and 2-hydroxy-1-{4-[4-(2-hydroxy-2-methyl-propionyl)-benzyl]phenyl}-2-methyl-propan-1-one.

Specific examples of the acylphosphine oxide compounds include 2,4,6-trimethylbenzoyl-diphenylphosphine oxide and bis(2,4,6-trimethylbenzoyl)-phenylphosphine oxide.

Specific examples of the oxime ester compounds include 1,2-octanedione 1-[4-(phenylthio)-2-(O-benzoyloxime)] and ethanone 1-[9-ethyl-6-(2-methylbenzoyl)-9H-carbazol-3-yl]-1-(O-acetyloxime).

Specific examples of the benzoin compounds include benzoin, benzoin methyl ether, benzoin ethyl ether, benzoin isopropyl ether, benzoin isobutyl ether and methyl 2-benzoylbenzoate.

Specific examples of the benzophenone compounds include benzyl dimethyl ketone, benzophenone, 4,4'-bis(dimethylamino)benzophenone and 4,4'-bis(diethylamino)benzophenone. Specific examples of the α-diketone compounds include diacetyl, dibenzoyl, and methyl benzoyl formate.

Specific examples of the biimidazole compounds include 2,2'-bis(2-chlorophenyl)-4,4',5,5'-tetrakis(4-ethoxycarbonylphenyl)-1,2'-biimidazole, 2,2'-bis(2,4-dichlorophenyl)-4,4'5,5'-tetrakis(4-ethoxycarbonylphenyl)-1,2'-biimidazole, 2,2'-bis(2,4,6-trichlorophenyl)-4,4',5,5'-tetrakis(4-ethoxycarbonylphenyl)-1,2'-biimidazole, 2,2'-bis(2-bromophenyl)-4,4',5,5'-tetrakis(4-ethoxycarbonylphenyl)-1,2'-biimidazole, 2,2'-bis(2,4-dibromophenyl)-4,4',5,5'-tetrakis(4-ethoxycarbonylphenyl)-1,2'-biimidazole, 2,2'-bis(2,4,6-tribromophenyl)-4,4',5,5'-tetrakis(4-ethoxycarbonylphenyl)-1,2'-biimidazole, 2,2'-bis(2-chlorophenyl)-4,4',5,5'-tetraphenyl-1,2'-biimidazole, 2,2'-bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2-bromophenyl)-4,4',5,5'-tetraphenyl-1,2'-biimidazole, 2,2'-bis(2,4-dibromophenyl)-4,4',5,5'-tetraphenyl-1,2'-biimidazole and 2,2'-bis(2,4,6-tribromophenyl)-4,4',5,5'-tetraphenyl-1,2'-biimidazole.

Specific examples of the polynuclear quinone compounds include anthraquinone, 2-ethylanthraquinone, 2-t-butylanthraquinone and 1,4-naphthoquinone.

Specific examples of the xanthone compounds include xanthone, thioxanthone, 2-chlorothioxanthone and 2,5-diethyldioxanthone.

Specific examples of the triazine compounds include 1,3,5-tris(trichloromethyl)-s-triazine, 1,3-bis(trichloromethyl)-5-(2'-chlorophenyl)-s-triazine, 1,3-bis(trichloromethyl)-5-(4'-chlorophenyl)-s-triazine, 1,3-bis(trichloromethyl)-5-(2'-methoxyphenyl)-s-triazine, 1,3-bis(trichloromethyl)-5-(4'-methoxyphenyl)-s-triazine, 2-(2'-furylethylidene)-4,6-bis(trichloromethyl)-s-triazine, 2-(4'-methoxystyryl)-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(2'-bromo-4'-methylphenyl)-4,6-bis(trichloromethyl)-s-triazine, and 2-(2'-thiophenylethylidene)-4,6-bis(trichloromethyl)-s-triazine.

From the viewpoint of superior thin film curability in particular, 2,4,6-trimethylbenzoyl-diphenylphosphine oxide, bis(2,4,6-trimethylbenzoyl)-phenylphosphine oxide, 2-hydroxy-1-{4-[4-(2-hydroxy-2-methyl-propionyl)-benzyl]phenyl}-2-methyl-propan-1-one, 1,2-octanedione 1-[4-(phenylthio)-2-(O-benzoyloxime)] and ethanone 1-[9-ethyl-6-(2-methylbenzoyl)-9H-carbazol-3-yl]-1-(O-acetyloxime) are preferable.

From the viewpoint of the cured product having superior transparency in particular, 1-hydroxycyclohexyl phenyl ketone, 2,2-dimethoxy-2-phenylacetophenone, 2-hydroxy-2-methyl-1-phenylpropan-1-one, 1-(4'-1-propylphenyl)-2-hydroxy-2-methylpropan-1-one, 4-(2'-hydroxyethoxy)phenyl(2-hydroxy-2-propyl)ketone and 2,2-dimethoxyacetophenone are preferable.

These radical polymerization initiators may be used alone or two or more of these may be used in combination. The amount of radical polymerization initiator used is preferably 0.1 to 15 parts by weight and more preferably 0.1 to 10 parts by weight relative to 100 parts by weight of the modified polyorganosiloxane compound. If the amount of radical polymerization initiator is excessively low, curing is inadequate and contrast tends not to be obtained upon development with alkali. If the amount of the initiator is excessively high, the cured film itself becomes colored, thereby making this undesirable.

The modified polyorganosiloxane compound used for the curable composition of the present invention may be obtained by various techniques such as condensation reaction and addition reaction by hydrolysis, and ring-opening polymerization. There are no particular limitations on the technique of introducing a specific organic structure into a polysiloxane compound structure. Hydrosilylation, which enables the structure to be regioselectively introduced with a chemically stable Si—C bond, is preferably used.

The following aspect is mentioned as a preferable modified polyorganosiloxane compound used for the curable composition of the present invention.

Hydrosilylation reaction product of the following compounds (α) to (γ):

(α) an organic compound having, in a molecule thereof, one or more carbon-carbon double bonds that have reactivity with SiH groups;

(β) an organosiloxane compound having at least two SiH groups in a molecule thereof; and (γ) a compound having, in a molecule thereof, at least one photopolymerizable function group and one or more carbon-carbon double bonds that have reactivity with SiH groups.

The following provides an explanation of the preferable aspect of the modified polyorganosiloxane compound.

(Compound (α))

Compound (α) will be described hereinafter.

There are no particular limitations on compound (α) provided it is an organic compound that has, in a molecule thereof, one or more carbon-carbon double bonds having reactivity with SiH groups, and the same compounds as for the above component (B), in particular, may be used.

From the viewpoint of superior insulating properties of the resulting cured product in particular, compounds represented by the following general formula (I):

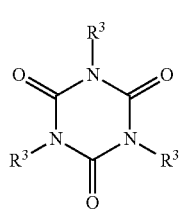

(wherein $R^3$ s each represent a $C_{1-50}$ monovalent organic group, and may be the same as or different from each other, and at least one $R^3$ contains a carbon-carbon double bond having reactivity with SiH groups) are preferable.

From the additional viewpoint of availability, examples thereof include triallyl isocyanurate, diallyl isocyanurate, diallyl monoglycidyl isocyanurate, diallyl monobenzyl isocyanurate, and diallyl monopropyl isocyanurate.

From the viewpoints of transparency and curability of the resulting cured product, polysiloxanes having an alkenyl group can be preferably applied. Among these, polysiloxane compounds having a vinyl group bonded to a silicon group (i.e., Si—CH=CH$_2$ group) are preferable from the viewpoint of availability of compounds.

Specific examples thereof include siloxanes having a vinyl group on the end or in a side chain thereof, and cyclic siloxanes having a vinyl group. Specific examples of the siloxanes having a vinyl group on the end or in a side chain thereof include compounds such as tetramethyldivinyldisiloxane and hexamethyltrivinyltrisiloxane.

Examples of the cyclic siloxanes include compounds such as 1,3,5,7-vinyl-1,3,5,7-tetramethylcyclotetrasiloxane, 1-propyl-3,5,7-trivinyl-1,3,5,7-tetramethylcyclotetrasiloxane, 1,5-divinyl-3,7-dihexyl-1,3,5,7-tetramethylcyclotetrasiloxane, 1,3,5-trivinyl-1,3,5-trimethylcyclosiloxane, 1,3,5,7,9-pentavinyl-1,3,5,7,9-pentamethylcyclosiloxane, and 1,3,5,7,9,11-hexavinyl-1,3,5,7,9,11-hexamethylcyclosiloxane.

The component (α) can be dissolved in an aqueous alkali solution and can provide an industrially useful curable composition having lithographic properties as a result of preferably having at least one member selected from the group consisting of moieties represented by the following formulas (X1) to (X3):

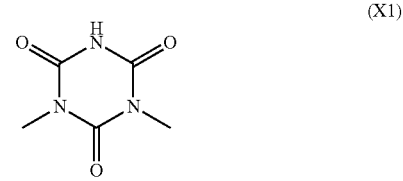

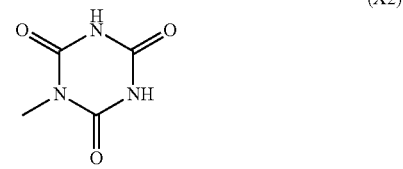

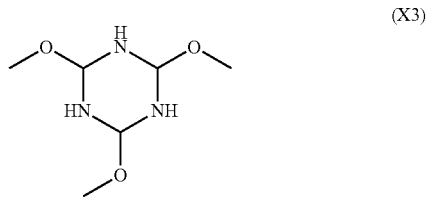

and a phenolic hydroxyl group and a carboxyl group (hereinafter, "the moieties represented by the formulas (X1) to (X3), a phenolic hydroxyl group and a carboxyl group" may be referred to as "acidic groups") within the same molecule.

From the viewpoint of superior heat resistance in particular, compounds having an isocyanuric acid structure are preferable among these, and specific examples thereof from the viewpoint of availability include diallyl isocyanurate and monoallyl isocyanurate.

These compounds can also be used in combination with an alkenyl compound free from an acidic group, and preferably used in combination with such an alkenyl compound having an isocyanurate ring structure, such as triallyl isocyanurate, diallyl monoglycidyl isocyanurate, or monoallyl diglycidyl isocyanurate, from the viewpoint of heat resistance in particular.

The compounds can also be preferably used in combination with a polysiloxane compound having an alkenyl group from the viewpoint of superior transparency of the resulting cured product. From the viewpoint of availability in particular, siloxanes whose end or side chain is blocked with a vinyl group are preferable, and cyclic siloxanes are particularly preferable.

Specific examples of the cyclic siloxanes include 1,3,5,7-vinyl-1,3,5,7-tetramethylcyclotetrasiloxane, 1-propyl-3,5,7-trivinyl-1,3,5,7-tetramethylcyclotetrasiloxane, 1,5-divinyl-3,7-dihexyl-1,3,5,7-tetramethylcyclotetrasiloxane, 1,3,5-trivinyl-1,3,5-trimethylcyclosiloxane, 1,3,5,7,9-pentavinyl-1,3,5,7,9-pentamethylcyclosiloxane, and 1,3,5,7,9,11-hexavinyl-1,3,5,7,9,11-hexamethylcyclosiloxane.

(Compound (β))

Compound (β) will be described hereinafter.

There are no particular limitations on compound (β) provided it is an organopolysiloxane compound having SiH groups, and for example, a compound described in WO 96/15194 having SiH groups can be used.

Acyclic organopolysiloxanes having at least two SiH groups in a molecule thereof, represented by the following formulas:

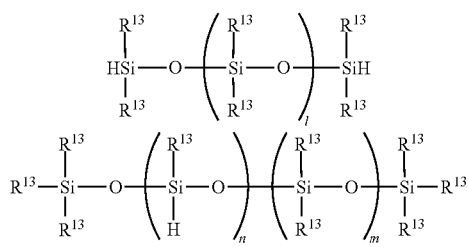

(wherein $R^{13}$ and $R^{14}$ each represent a $C_{1-6}$ organic group, and may be the same or different, l represents a number of 0 to 50, n represents a number of 1 to 50, and m represents a number of 0 to 10) are preferable because they give flexibility to a cured product. $R^{13}$ and $R^{14}$ are each preferably a methyl group from the viewpoints of availability and heat resistance in particular, and preferably a phenyl group from the viewpoint of higher strength of the resulting cured product in particular.

Among these, from the viewpoint of greater heat resistance of the cured product, organopolysiloxanes having at least two SiH groups in a molecule thereof and having a T or Q structure in the molecule and represented by the following formulas:

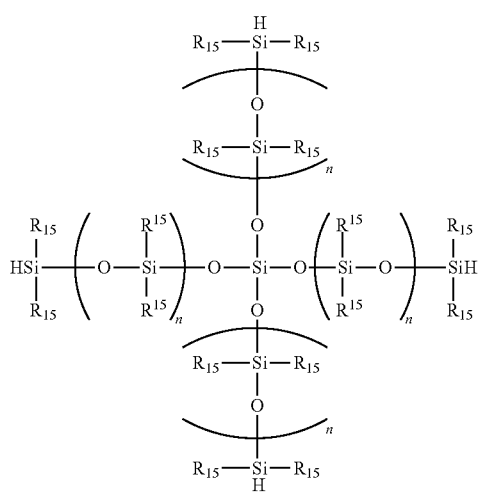

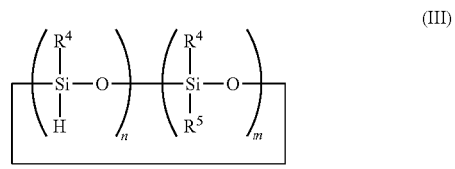

(wherein $R^{15}$ and $R^{16}$ each represent a $C_{1-6}$ organic group, and n represents a number of 0 to 50) are preferable, and $R^{15}$ and $R^{16}$ are each preferably a methyl group from the viewpoints of availability and heat resistance in particular.

From the viewpoints of availability and good reactivities with compounds (α), (α2) and (γ), preferable among these are organosiloxanes represented by the following general formula (III):

$$\left[\left(\begin{array}{c} R^4 \\ | \\ Si-O \\ | \\ H \end{array}\right)_n \left(\begin{array}{c} R^4 \\ | \\ Si-O \\ | \\ R^5 \end{array}\right)_m\right] \quad (III)$$

wherein, $R^4$ and $R^5$ each represent a $C_{1-6}$ organic group, and may be the same or different, n represents a number of 1 to 10, and m represents a number of 0 to 10, and "n+m" represents a number of 3 or more. Of these, cyclic organopolysiloxanes having at least three SiH groups in a molecule thereof are preferable.

Substituents $R^4$ and $R^5$ in a compound represented by the general formula (III) each are preferably composed of elements selected from the group consisting of C, H and O, are more preferably a hydrocarbon group, and are even more preferably a methyl group.

A preferable compound represented by the general formula (III) is 1,3,5,7-tetramethylcyclotetrasiloxane from the viewpoints of ease of availability and reactivity.

The above-mentioned compound (β) can be used as a single species or two or more species thereof can be used as a mixture.

(Compound (γ))

Compound (γ) will be described hereinafter.

There are no particular limitations on compound (γ) provided it is a compound that has, in a molecule thereof, at least one photopolymerizable functional group and one or more carbon-carbon double bonds having reactivity with SiH groups. It is noted that the photopolymerizable functional group referred to here is the same as the photopolymerizable functional group possessed by the previously described modified polyorganosiloxane compound, and the preferable aspects of the foregoing are similarly preferable here.

As far as the photopolymerizable functional group is concerned in particular, at least one photopolymerizable functional group is preferably selected from an epoxy group, a crosslinkable silicon group, a (meth)acryloyl group, an oxetanyl group, and a vinyloxy group from the viewpoints of reactivity and stability of compounds.

Specific examples of compound (γ) having an epoxy group as the photopolymerizable functional group include vinylcyclohexene oxide, allyl glycidyl ether, diallyl monoglycidyl isocyanurate and monoallyl diglycidyl isocyanurate, and from the viewpoint of superior photopolymerizability, vinylcyclohexene oxide which is a compound having an alicyclic epoxy group is particularly preferable.

Specific examples of compound (γ) having an oxetanyl group as the photopolymerizable functional group include allyl oxetanyl ether and vinyl oxetanyl ether. The compound having an oxetanyl group is preferable from the viewpoint of the improvement in toughness of a cured product.

As specific examples of compound (γ) having a crosslinkable silicon group as the photopolymerizable functional group from the viewpoints of ease of availability and heat resistance, compounds having a crosslinkable silicon group represented by the following general formula (IV):

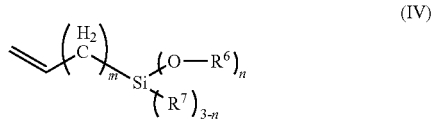

(IV)

(wherein $R^6$ and $R^7$ each represent a $C_{1-6}$ organic group, n represents a number of 1 to 3, and m represents a number of 0 to 10) are preferable, and from the viewpoint of, for example, ease of removal of by-products following the reaction, trimethoxyvinylsilane, triethoxyvinylsilane, dimethoxymethylvinylsilane, diethoxymethylvinylsilane, methoxydimethylvinylsilane and ethoxydimethylvinylsilane are particularly preferable.

Examples of compounds (γ) having a (meth)acryloyl group as the photopolymerizable functional group include allyl (meth)acrylate, vinyl (meth)acrylate, dicyclopentenyl (meth) acrylate, dicyclopentenyloxyethyl (meth)acrylate, (meth) acrylate-modified allyl glycidyl ether (product name: Denacol Acrylate DA111, Nagase Chemtex) and a compound having one or more vinyl or allyl groups and one or more organic groups represented by the following general formula (IX):

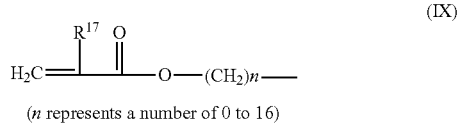

(IX)

($n$ represents a number of 0 to 16)

(wherein $R^{17}$ represents a hydrogen atom or methyl group) within the same molecule, such as a compound of the above-mentioned general formula (I) in which at least one of $R^3$s is a group represented by the general formula (IX) above, and at least one of $R^3$s is a group such as a vinyl group or allyl group which contains a carbon-carbon double bond having reactivity with SiH groups. From the viewpoint of high selectivity of hydrosilylation, preferable is a compound in which a methacryloyl group and an allyl or vinyl group are present together within the same molecule, and particularly in terms of availability, a compound such as allyl methacrylate or vinyl methacrylate is preferable.

Two or more species of compound (γ) can be used in combination during the hydrosilylation reaction, regardless of the particular photopolymerizable functional groups.
(Hydrosilylation Catalyst)

Examples of a catalyst that may be used in a hydrosilylation reaction of compound (α), compound (β) and compound (γ), and optionally compound (α2) depending on the aspects include: elemental platinum; substances in which solid platinum is supported on a carrier such as alumina, silica, or carbon black; chloroplatinic acid; complexes of chloroplatinic acid with an alcohol, aldehyde, ketone, or the like; platinum-olefin complexes (for example, $Pt(CH_2=CH_2)_2(Pn_3)_2$, $Pt(CH_2=CH_2)_2Cl_2$); platinum-vinylsiloxane complexes (for example, $Pt(ViMe_2SiOSiMe_2Vi)_n$, $Pt[(MeViSiO)_4]_m$); platinum-phosphine complexes (for example, $Pt(PPh_3)_4$, $Pt(PBu_3)_4$); and platinum-phosphite complexes (for example, $Pt[P(OPh)_3]_4$, $Pt[P(OBu)_3]_4$) (in the foregoing formulas, Me represents a methyl group, Bu represents a butyl group, Vi represents a vinyl group, Ph represents a phenyl group, and n and m each represent an integer); dicarbonyldichloroplatinum; Karstedt catalyst; platinum-hydrocarbon complexes described in U.S. Pat. Nos. 3,159,601 and 3,159,662 to Ashby; and platinum alcoholate catalysts described in U.S. Pat. No. 3,220,972 to Lamoreaux. Moreover, platinum chloride-olefin complexes described in U.S. Pat. No. 3,516,946 to Modic are also useful in the present invention.

Examples of catalysts other than platinum compounds include $RhCl(PPh_3)_3$, $RhCl_3$, $RhAl_2O_3$, $RuCl_3$, $IrCl_3$, $FeCl_3$, $AlCl_3$, $PdCl_2 \cdot 2H_2O$, $NiCl_2$, and $TiCl_4$.

From the viewpoint of catalytic activity, chloroplatinic acid, platinum-olefin complexes, platinum-vinylsiloxane complexes and the like are preferable among these catalysts. These catalysts may be used alone or two or more of these may be used in combination.

Although there are no particular limitations on the amount of catalyst added, in order to give sufficient curability and keep the cost of the curable composition comparatively low, the preferable lower limit of the amount added is $10^{-8}$ moles and more preferably $10^{-6}$ moles relative to 1 mole of carbon-carbon double bonds (having reactivity with SiH groups) of compound (α) and compound (γ) (which moieties may be simply referred to below as "alkenyl groups") or 1 mole of alkenyl groups of compound (α) and compound (γ), while the preferable upper limit of the amount added is $10^{-1}$ moles and more preferably $10^{-2}$ moles relative to 1 mole of alkenyl groups of the compounds.

A co-catalyst can also be used in combination with the above-mentioned catalyst, and examples thereof include phosphorous compounds such as triphenylphosphine, 1,2-diester compounds such as dimethyl malate, acetylene alcohol compounds such as 2-hydroxy-2-methyl-1-butyne and 1-ethynyl-1-cyclohexanol, and sulfur compounds such as elemental sulfur. Although there are no particular limitations on the amount of co-catalyst added, the preferable lower limit of the amount added is $10^{-2}$ moles and more preferably $10^{-1}$ moles relative to 1 mol of hydrosilylation catalyst, while the preferable upper limit of the amount added is $10^2$ moles and more preferably 10 moles.
(Reaction of Compound (α), Compound (β) and Compound (γ))

Examples of the modified polyorganosiloxane compound that can be used for the curable composition of the present invention include, as described above, compounds obtainable by reacting compound (α), compound (β) and compound (γ) in the presence of a hydrosilylation catalyst.

Although there are various examples of the order and method of the reaction, from the viewpoint of simplifying the synthesis step, a method in which compound (α), compound (β) and compound (γ) are allowed to undergo a hydrosilylation reaction in a one-pot approach followed finally by removing unreacted compounds is preferable.

From the viewpoint of reducing the content of low molecular weight substances, a more preferable method includes carrying out a hydrosilylation reaction on an excess of compound (α) and compound (β), or on an excess of compound (β) and compound (α); subsequently removing unreacted compound (α) or compound (β); and carrying out a hydrosilylation reaction on the resulting reaction product and compound (γ).

Although there are no particular limitations on the reaction ratio of the compounds for modification, when defining the total amount of alkenyl groups of compounds (α) and (γ) as A, and defining the total amount of SiH groups of compound (β) as B, the ratio of B to A is then preferably such that $1 \leq B/A \leq 30$ and more preferably $1 \leq B/A \leq 10$. In the case of $1 > B/A$, unreacted alkenyl groups remain in the composition, causing coloring, while in the case of $30 < B/A$, a large amount of component (β) is used, which causes increase in production cost and therefore is not preferable.

Compound (α) and compound (γ) may be reacted for modification so that the modification ratio of compound (α) and compound (γ) is appropriately selected in the range such that given $A1+A2=1$, $0.01 \leq A1 \leq 0.99$ and $0.01 \leq A2 < 0.99$ (wherein A1 represents the amount of alkenyl groups of compound (α) and A2 represents the amount of alkenyl groups of compound (γ)).

Although various temperatures can be set for the reaction temperature, the lower limit of the temperature range in this case is preferably 30° C. and more preferably 50° C., while the upper limit of the temperature range is preferably 200° C. and more preferably 150° C. If the reaction temperature is excessively low, the reaction time required for sufficient reaction becomes long, while if the reaction temperature is excessively high, the reaction is not practical. Although the reaction may be carried out at a constant temperature, the temperature may be changed in a stepwise manner or continuously as necessary.

The reaction time and the pressure during the reaction can also be set to various values as necessary.

Oxygen may be used during the hydrosilylation reaction. Adding oxygen to the gas phase in the reaction vessel makes it possible to accelerate the hydrosilylation reaction. From the viewpoint of making the amount of oxygen added lower than the lower explosion limit, the volumetric oxygen concentration of the gas phase must be controlled to 3% or less. From the viewpoint of realizing the effect of accelerating the hydrosilylation reaction by adding oxygen, the volumetric oxygen concentration of the gas phase is preferably 0.1% or more and more preferably 1% or more.

A solvent may be used upon the hydrosilylation reaction. There are no particular limitations on solvents that may be used provided they do not inhibit the hydrosilylation reaction. Preferable examples thereof include hydrocarbon solvents, ether solvents, ketone solvents, and halogenated solvents. A mixed solvent of two or more species of solvents may be used for the solvent, and the amount thereof may also be appropriately adjusted.

Preferably, specific examples of the hydrocarbon solvents include benzene, toluene, hexane and heptane, specific examples of the ether solvents include tetrahydrofuran, 1,4-dioxane, 1,3-dioxolane and diethyl ether, specific examples of the ketone solvents include acetone and methyl ethyl ketone, and specific examples of the halogenated solvents include chloroform, methylene chloride and 1,2-dichloroethane. Toluene, tetrahydrofuran, 1,3-dioxolane and chloroform are preferable among these solvents.

Solvents and/or unreacted compounds may be removed after having carried out a hydrosilylation reaction between compound (α), compound (β) and compound (γ). Removal of these volatile components is less likely to cause problems of voids and cracks resulting from evaporation of the volatile components in the case of producing a cured product from the reaction product because the reaction product thus treated has no volatile components. Examples of the removal method include reduced-pressure volatilization. In the case of the reduced-pressure volatilization, the process is preferably performed at low temperatures. In this case, the upper limit is preferably 100° C. and more preferably 80° C. The process performed at high temperatures tends to involve degeneration such as thickening.

Various additives may be used according to the objectives in the above-mentioned production method of the modified organopolysiloxane compound to be used for the curable composition of the present invention.

(Curable Composition Preparation and Curing Methods)

There are no particular limitations on the method used to prepare the curable composition and it can be prepared by various methods. The curable composition may be prepared by mixing components immediately prior to curing, or the curable composition may be stored at a low temperature in the form of one pack in which all components have been mixed in advance.

There are no particular limitations on the method of applying the curable composition of the present invention, and the curable composition may be applied by employing coating such as spin coating or slit coating, potting with a dispenser, or the like. In addition, viscosity adjustment using a solvent and adjustment of surface tension with a surfactant may be appropriately carried out according to the condition of a base material.

The resin composition of the present invention is irradiated with light to allow the crosslinking reaction to proceed to give a cured product. Any light source that emits light at the absorption wavelength of the polymerization initiator or sensitizer used may be used as the light source for photocuring, and a light source can normally be used that has a wavelength within the range of 200 to 450 nm, examples of which include a high-pressure mercury lamp, an ultra-high-pressure mercury lamp, a metal halide lamp, a high-power metal halide lamp, a xenon lamp, a carbon arc lamp and a light-emitting diode.

Although there are no particular limitations on the amount of exposure, the amount of exposure is preferably in the range of 1 to 5000 mJ/cm$^2$ and more preferably 1 to 1000 mJ/cm$^2$. If the amount of exposure is excessively low, curing will not occur. If the amount of exposure is excessively high, discoloration may occur due to too rapid curing. Curing time is preferably within the range of 30 to 120 seconds and more preferably 1 to 60 seconds. If curing time is excessively long, it is not possible to take advantage of the characteristic of rapid curing with respect to photocuring.

Although there are no particular limitations on the temperature of heating following film formation, the temperature is preferably 250° C. or lower from the viewpoint of smaller effects on surrounding members which have low heat resistance, and the temperature of the resin material is preferably 200° C. or higher. In the case of using a substrate such as a resin substrate, the temperature is preferably 150° C. or lower in consideration of properties of the substrate such as dimensional stability. More preferably, the resin composition is cured by heating at a temperature of 100° C. or lower.

(Photolithography)

The curable composition of the present invention may be used for fine patterning by alkali development. There are no particular limitations on the method for forming a pattern, and a desired pattern can be formed by dissolving and removing unexposed portions by a commonly employed developing method such as immersion or spraying.

Here, a commonly used developing solution can be used without any particular limitations, specific examples of which include organic alkali aqueous solutions such as an aqueous tetramethylammonium hydroxide solution and an aqueous choline solution, inorganic alkali aqueous solutions such as an aqueous potassium hydroxide solution, an aqueous sodium hydroxide solution, an aqueous potassium carbonate solution, an aqueous sodium carbonate solution and an aqueous lithium carbonate solution, and solutions obtained by adding an alcohol, surfactant or the like to these aqueous solutions to adjust dissolution rate and the like.

The concentration of the aqueous solution is preferably 25% by weight or less, more preferably 10% by weight or less, and even more preferably 5% by weight or less from the viewpoint of sharper contrast between exposed portions and unexposed portions.

(Insulating Properties)

A cured product obtained from the composition of the present invention is applicable to electronic components requiring high insulating properties.

The thin film of the present invention can also be applied as an insulator to any of the above-mentioned semiconductor layers without any particular limitations. For example, the thin film of the present invention can be applied to gate insulators and passivation layers such as insulators for TFTs requiring thinness and high insulating properties.

In the case of production of an electrical device such as a thin film transistor, since the presence of leakage current or the like in the insulating layer leads to signal response delays, erroneous operation and device defects, the insulator of the device is required to have high insulating properties. Specifically, since an insulator formed from a resin composition such as that able to be formed by solution coating cannot be applied when the amount of leakage current thereof is excessively large upon applying a voltage to the thin film, the insulating properties of the insulator are required to be such that the amount of leakage current between electrodes is 20 nA/cm$^2$ or less when a voltage of 30 V is applied to a thin film thereof with a thickness of 0.5 μm or less formed between the electrodes.

Moreover, in consideration of reliability for electronic components, the amount of leakage current is preferably 15 nA/cm$^2$ or less, more preferably 10 nA/cm$^2$ or less, further preferably 7 nA/cm$^2$ or less, and particularly preferably 5 nA/cm$^2$ or less.

With respect to the film thickness of the insulator, insulating reliability tends to increase with larger film thickness, and the amount of leakage current between electrodes thus tends to decrease, but in the case of application to insulators of LSI elements, TFTs and the like, the insulator preferably has high insulating properties at a thinner film thickness in order to reduce the element size and thickness, and preferably has an amount of leakage current between electrodes as indicated above at a film thickness of the insulator of preferably 1.0 μm or less, more preferably 0.7 μm or less, and particularly preferably 0.5 μm or less. If possible, the film thickness is preferably 0.3 μm or less.

Moreover, in order to form a multilayer structure upon production of a transistor, it is preferable that the film thickness is even thinner and the insulating properties are maintained. Thus, the insulator preferably has an amount of leakage current between electrodes as indicated above in the form of a thin film with a film thickness of preferably 0.7 μm or less and more preferably 0.2 μm or less.

Moreover, this insulator preferably has superior environmental resistance, and preferably maintains the insulating properties thereof even during long-term storage under low-temperature conditions of −60 to 0° C., under high-temperature conditions of 20 to 100° C., or even under high-temperature and high-humidity conditions of 20 to 90° C. at 20 to 100% RH.

Although there will be no problem with respect to the applied voltage if the leakage current is small at a voltage level ordinarily applied as the TFT drive voltage, in consideration of long-term reliability and momentary overvoltages immediately after application, the amount of leakage current at any voltage value preferably between 0 and 50 V is preferably at a low level as described above, and the insulating properties are preferably maintained at the level indicated above upon applying a voltage of more preferably 0 to 100 V and even more preferably 0 to 200 V regardless of an AC voltage or a DC voltage.

(Additives)

(Sensitizer)

In the curable composition of the present invention, a sensitizer may be appropriately added in order to improve photosensitivity and impart sensitivity to high wavelength light such as g rays (436 nm), h rays (405 nm) or i rays (365 nm) in the case of curing with light energy. Such a sensitizer can be used in combination with a component such as the above-mentioned cationic polymerization initiator and/or radical polymerization initiator to adjust curability.

Specific examples of a compound that can be used as the sensitizer include anthracene compounds and thioxanthone compounds.

Specific examples of the anthracene compounds include anthracene, 2-ethyl-9,10-dimethoxyanthracene, 9,10-dimethylanthracene, 9,10-dibutoxyanthracene, 9,10-dipropoxyanthracene, 9,10-diethoxyanthracene, 1,4-dimethoxyanthracene, 9-methylanthracene, 2-ethylanthracene, 2-tert-butylanthracene, 2,6-di-tert-butylanthracene, and 9,10-diphenyl-2,6-di-tert-butylanthracene. From the viewpoint of ease of availability in particular, anthracene, 9,10-dimethylanthracene, 9,10-dibutoxyanthracene, 9,10-dipropoxyanthracene, 9,10-diethoxyanthracene and the like are preferable.

Specific examples of the thioxanthone compounds include thioxanthone, 2-chlorothioxanthone and 2,5-diethyldioxanthone.

Anthracene compounds are preferable from the viewpoint of superior transparency of the cured product. Specifically, 9,10-dibutoxyanthracene, 9,10-dipropoxyanthracene, 9,10-diethoxyanthracene and the like are more preferable from the viewpoints of good compatibility with the curable composition and superior transparency of the cured product.

The mentioned sensitizers may be used alone or two or more thereof may be used in combination.

(Reactive Diluent)

In the curable composition of the present invention, a reactive diluent may be appropriately added in order to adjust workability, reactivity, adhesion and the strength of the cured product. The compound to be added can be selected according to the type of curing reaction without any particular limitations. Compounds having a polymerizable group, such as epoxy compounds, oxetane compounds, alkoxysilane compounds and (meth)acrylate compounds, can be used.

Specific examples of the epoxy compounds and oxetane compounds include phenol novolak-type epoxy resins, biphenyl-type epoxy resins, dicyclopentadiene-type epoxy resins, cyclohexylepoxy group-containing polyorganosiloxanes (cyclic, acyclic), glycidyl group-containing polyorganosiloxanes (cyclic, acyclic), bisphenol F diglycidyl ether, bisphenol A diglycidyl ether, 2,2'-bis(4-glycidyloxycyclohexyl)propane, 3,4-epoxycyclohexylmethyl-3,4-epoxycyclohexane carboxylate, vinylcyclohexene dioxide, 2-(3,4-epoxycyclohexyl)-5,5-spiro-(3,4-epoxycyclohexane)-1,3-dioxane, bis (3,4-epoxycyclohexyl)adipate, 1,2-cyclopropanedicarboxylic acid bisglycidyl ester, triglycidyl isocyanurate, monoallyl diglycidyl isocyanurate, diallyl monoglycidyl isocyanurate, 1,4-bis{{(3-ethyl-3-oxetanyl)methoxy}methyl}benzene, bis{1-ethyl(3-oxetanyl)}methyl ether, 3-ethyl-3-(phenoxymethyl)oxetane, and 3-ethyl-3-(2-ethylhexyloxymethyl)oxetane.

Specific examples of the alkoxysilane compounds include tetramethoxy(ethoxy)silane and condensation products thereof, methyltrimethoxy(ethoxy)silane and condensation products thereof, and dimethyldimethoxy(ethoxy)silane and condensation products thereof.

Specific examples of the (meth)acrylate compounds include allyl (meth)acrylate, vinyl (meth)acrylate, dicyclopentenyl (meth)acrylate, dicyclopentenyloxyethyl (meth)acrylate, (meth)acrylate-modified allyl glycidyl ether (product name: Denacol Acrylate DA111, Nagase Chemtex), urethane (meth)acrylates, epoxy (meth)acrylates, trimethylolpropane tri(meth)acrylate, pentaerythritol tetra(meth) acrylate, ditrimethylolpropane tetra(meth)acrylate, dipentaerythritol hexa(meth)acrylate, butanediol di(meth)acrylate, nonanediol di(meth)acrylate, polypropylene glycol-based (meth)acrylates, bisphenol A di(meth)acrylate, tris(2-(meth) acryloyloxyethyl)isocyanurate and (meth)acrylate group-containing polyorganosiloxanes.

Although various amounts can be set for the amount of reactive diluent added, the amount added is preferably 1 to 50 parts by weight and more preferably 3 to 25 parts by weight relative to 100 parts by weight of the modified polyorganosiloxane compound. If the amount added is excessively low, the effects of addition are not manifested, while if the amount added is excessively high, the reactive diluent may have a detrimental effect on the physical properties of the cured product.

(Adhesion Promoter)

An adhesion promoter may be added in the curable composition of the present invention. Examples of the adhesion promoter not only include commonly used adhesives but also, for example, various coupling agents, epoxy compounds, oxetane compounds, phenol resins, coumarone-indene resins, rosin ester resins, terpene-phenol resins, α-methylstyrene-vinyltoluene copolymers, polyethylmethylstyrene and aromatic polyisocyanates.

Examples of the coupling agents include silane coupling agents. There are no particular limitations on the silane coupling agent provided it has at least one functional group having reactivity with an organic group and at least one hydrolyzable silicon group in a molecule thereof. As the group having reactivity with an organic group, at least one functional group selected from an epoxy group, a methacrylic group, an acrylic group, an isocyanate group, an isocyanurate group, a vinyl group and a carbamate group is preferable from the viewpoint of handling ease, and an epoxy group, methacrylic group or acrylic group is particularly preferable from the viewpoints of curability and adhesion. The hydrolyzable silicon group is preferably an alkoxysilyl group from the viewpoint of handling ease, and particularly preferably a methoxysilyl group or ethoxysilyl group from the viewpoint of reactivity.

Preferable examples of the silane coupling agent include alkoxysilanes having an epoxy functional group such as 3-glycidoxypropyltrimethoxysilane, 3-glycidoxypropyltriethoxysilane, 2-(3,4-epoxycyclohexyl)ethyltrimethoxysilane and 2-(3,4-epoxycyclohexyl)ethyltriethoxysilane; and alkoxysilanes having a methacrylic group or acrylic group such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane and acryloxymethyltriethoxysilane.

Although various amounts can be set for the amount of silane coupling agent added, the amount added is preferably 0.1 to 20 parts by weight, more preferably 0.3 to 10 parts by weight, and even more preferably 0.5 to 5 parts by weight relative to 100 parts by weight of the modified polyorganosiloxane compound. If the amount added is excessively low, the adhesion-promoting effect is not manifested, while if the amount added is excessively high, there may be detrimental effects on curability and the physical properties of the cured product.

These coupling agents, silane coupling agents, epoxy compounds and the like may be used alone or two or more of these may be used in combination.

A carboxylic acid and/or acid anhydride may be used in the present invention to enhance the effects of the coupling agent or epoxy compound, thereby making it possible to improve and/or stabilize adhesion. Although there are no particular limitations on such a carboxylic acid and/or acid anhydride, examples include 2-ethylhexanoic acid, cyclohexanecarboxylic acid, cyclohexanedicarboxylic acid, methylcyclohexanedicarboxylic acid, tetrahydrophthalic acid, methyltetrahydrophthalic acid, methylhimic acid, norbornenedicarboxylic acid, hydrogenated methylnadic acid, maleic acid, acetylenedicarboxylic acid, lactic acid, malic acid, citric acid, tartaric acid, benzoic acid, hydroxybenzoic acid, cinnamic acid, phthalic acid, trimellitic acid, pyromellitic acid, naphthalenecarboxylic acid, naphthalenedicarboxylic acid, and anhydrides of these individual acids or mixtures of these acids.

Among these carboxylic acids and/or acid anhydrides, from the viewpoint of causing less impairment of the physical properties of the resulting cured product, examples of preferable carboxylic acids and/or acid anhydrides include tetrahydrophthalic acid, methyltetrahydrophthalic acid and anhydrides of these individual acids or a mixture of these acids.

Although various amounts can be set for the amount of carboxylic acid and/or acid anhydride used, the amount added is preferably in the range of 0.1 to 50 parts by weight and more preferably 1 to 10 parts by weight relative to 100 parts by weight of the coupling agent and/or epoxy compound. If the amount added is excessively low, the adhesion-promoting effect is not manifested, while if the amount added is excessively high, there may be detrimental effects on the physical properties of the cured product.

These carboxylic acids and/or acid anhydrides may be used alone or two or more of these may be used in combination.

(Phosphorous Compound)

In the case that the curable composition of the present invention is cured by light or heat and is used in an application requiring transparency in particular, a phosphorous compound is preferably used to improve hue after curing by light or heat. Preferable examples of the phosphorous compound include phosphorous antioxidants and phosphorous coloring prevention agents.

Specific examples of the phosphorous antioxidants include phosphites such as triphenyl phosphite, diphenyl isodecyl phosphite, phenyl diisodecyl phosphite, tris(nonylphenyl) phosphite, diisodecyl pentaerythritol diphosphite, tris(2,4-di-t-butylphenyl)phosphite, cyclic neopentanetetraylbis(octadecylphosphite), cyclic neopentanetetraylbis(2,4-di-t-butylphenyl)phosphite, cyclic neopentanetetraylbis(2,6-di-t-butyl-4-methylphenyl)phosphite and bis[2-t-butyl-6-methyl-4-{2-(octadecyloxycarbonyl)ethyl}phenyl]hydrogen phosphite.

Specific examples of the phosphorous coloring prevention agents include oxaphosphaphenanthrene oxides such as 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide and 10-decyloxy-9,10-dihydro-9-oxa-10-phosphaphenanthrene-10-oxide.

The amount of phosphorous compound used is preferably 0.01 to 10 parts by weight and more preferably 0.1 to 5 parts by weight relative to 100 parts by weight of the modified polyorganosiloxane compound. If the amount of phosphorous compound used is excessively small, the effect of improving hue is diminished. If the amount used is excessively large, there may be detrimental effects on curability and the physical properties of the cured product.

(Thermoplastic Resin)

Various thermoplastic resins may be added in the curable composition for the purpose of improving properties of the composition. Specific examples of the thermoplastic resin include acrylic reins, polycarbonate resins, resins obtained by homopolymerization of norbornene derivatives or by copolymerization thereof with vinyl monomers, cycloolefin resins, olefin-maleimide resins, polyester resins, polyethersulfone resins, polyarylate resins, polyvinylacetal resins, polyethylene resins, polypropylene resins, polystyrene resins, polyamide resins, silicone resins, fluorine resins, and rubber-like resins.

Examples of the acrylic reins include polymethyl methacrylate resins such as homopolymers of methyl methacrylate or random, block or graft copolymers of methyl methacrylate and other monomers (for example, Optorez manufactured by Hitachi Chemical) and polybutyl acrylate resins such as homopolymers of butyl acrylate or random, block or graft copolymers of butyl acrylate and other monomers.

Examples of the polycarbonate resins include polycarbonate resins having a monomer structure such as bisphenol A or 3,3,5-trimethylcyclohexylidene bisphenol (for example, APEC manufactured by Teijin).

Examples of the cycloolefin resins include hydrogenation products of resins obtained by ring-opening metathesis polymerization of norbornene derivatives (for example, APEL manufactured by Mitsui Chemicals, ZEONOR and ZEONEX manufactured by Zeon Corporation, and ARTON manufactured by JSR).

Examples of the olefin-maleimide resins include copolymers of ethylene and maleimide (for example, TI-PAS manufactured by Tosoh).

Examples of the polyester resins include polyesters obtained by polycondensation of bisphenols (e.g. bisphenol A and bis(4-(2-hydroxyethoxy)phenyl)fluorine) or diols (e.g. diethylene glycol) and phthalic acids (e.g. terephthalic acid and isophthalic acid) or other acids (e.g. aliphatic dicarboxylic acids) (for example, O-PET manufactured by Kanebo).

Examples of the rubber-like resins include natural rubber and EPDM.

The thermoplastic resin may have a carbon-carbon double bond having reactivity with SiH groups and/or an SiH group in a molecule thereof. From the viewpoint of higher toughness of the resulting cured product, the thermoplastic resin preferably has a carbon-carbon double bond having reactivity with SiH groups and/or an SiH group in a molecule thereof.

The thermoplastic resin may have a crosslinkable group. Examples of crosslinkable groups that can be used here include an epoxy group, an amino group, a radical-polymerizable unsaturated group, a carboxyl group, an isocyanate group, a hydroxyl group and an alkoxysilyl group. The thermoplastic resin preferably has an average of one or more crosslinkable groups in a molecule thereof from the viewpoint of greater heat resistance of the resulting cured product.

Although there are no particular limitations on the molecule weight of the thermoplastic resin, the number average molecular weight thereof is preferably 10,000 or less and more preferably 5,000 or less from the viewpoint of better compatibility with the modified organosiloxane compound. On the other hand, the number average molecular weight is preferably 10,000 or more and more preferably 100,000 or more from the viewpoint of higher toughness of the resulting cured product. Although there are no particular limitations on the molecular weight distribution as well, the molecular weight distribution is preferably 3 or less, more preferably 2 or less and even more preferably 1.5 or less from the viewpoints of lower viscosity of the mixture and better moldability.

Although there are no particular limitations on the incorporated amount of thermoplastic resin, the amount used is preferably in the range of 5 to 50% by weight and more preferably 10 to 30% by weight of the entire curable composition. If the amount added is excessively low, the resulting cured product tends to become brittle. If the amount added is excessively high, heat resistance (modulus of elasticity at high temperatures) tends to decrease.

A single thermoplastic resin may be used, or a plurality thereof may be used in combination.

The thermoplastic resin may be dissolved in the modified polyorganosiloxane compound prior to mixing, may be crushed into particles prior to mixing, or may be treated, for example dissolved in a solvent prior to mixing, so as to be dispersed. The thermoplastic resin is preferably dissolved in the modified polyorganosiloxane compound to form a uniform mixture prior to mixing from the viewpoint of higher transparency of the resulting cured product. Further, in this case, the thermoplastic resin may be dissolved directly in the modified polyorganosiloxane compound, or may be uniformly mixed using a solvent or the like. In the case of using a solvent, the mixture may subsequently be subjected to removal of the solvent so as to form a uniform dispersion or/and mixture.

In the case of dispersing the thermoplastic resin, although the average particle diameter can be set to various values, the preferable lower limit of the average particle diameter is 10 nm and the preferable upper limit of the average particle diameter is 0.5 μm. Although the particle system may have a distribution, and may be monodispersed or have a plurality of peak particle diameters, the coefficient of variation of the particle diameter is preferably 10% or less from the viewpoints of lower viscosity of the curable composition and better moldability.

(Filler)

In the curable composition, a filler may be added as necessary.

Although various substances can be used as the filler, examples thereof include silica-based fillers such as quartz, fumed silica, precipitated silica, silicic anhydride, fused silica, crystalline silica and ultrafine amorphous silica; inorganic fillers such as silicon nitride, silver powder, alumina, aluminum hydroxide, titanium oxide, glass fiber, carbon fiber, mica, carbon black, graphite, diatomaceous earth, white clay, clay, talc, calcium carbonate, magnesium carbonate, barium sulfate and inorganic balloons; and other fillers commonly used or/and proposed for use as fillers of conventional sealing materials such as epoxy sealing materials.

(Anti-Aging Agent)

An anti-aging agent may be added in the curable composition of the present invention. In addition to commonly used anti-aging agents such as hindered phenols, other examples of the anti-aging agent include citric acid, phosphoric acid and sulfur-based anti-aging agents.

Examples of the hindered phenol anti-aging agents include various compounds such as Irganox 1010 available from Ciba Specialty Chemicals.

Examples of the sulfur-based anti-aging agents include mercaptans, mercaptan salts, sulfide carboxylic acid esters, sulfides including hindered phenol-based sulfides, polysulfides, dithiocarboxylic acid salts, thioureas, thiophosphates, sulfonium compounds, thioaldehydes, thioketones, mercaptals, mercaptoles, monothio acids, polythio acids, thioamides and sulfoxides.

These anti-aging agents may be used alone or two or more of these may be used in combination.

(Radical Inhibitor)

A radical inhibitor may be added in the curable composition of the present invention. As the radical inhibitor, phenol-based radical inhibitors, amine-based radical inhibitors and the like may be used.

Examples of the phenol-based radical inhibitors include 2,6-di-t-butyl-3-methylphenol (BHT), 2,2'-methylene-bis(4-methyl-6-t-butylphenol) and tetrakis(methylene-3(3,5-di-t-butyl-4-hydroxyphenyl)propionate)methane. Examples of the amine-based radical inhibitors include phenyl-β-naphthylamine, α-naphthylamine, N,N'-sec-butyl-p-phenylenediamine, phenothiazine and N,N'-diphenyl-p-phenylenediamine.

These radical inhibitors may be used alone or two or more of these may be used in combination.

(Ultraviolet Absorber)

An ultraviolet absorber may be added in the curable composition of the present invention. Examples of the ultraviolet absorber include 2-(2'-hydroxy-3',5'-di-t-butylphenyl)benzotriazole and bis(2,2,6,6-tetramethyl-4-piperidine)sebacate. These ultraviolet absorbers may be used alone or two or more of these may be used in combination.

(Solvent)

The modified polyorganosiloxane compound used in the curable composition of the present invention can be used dissolved in a solvent in the case it has high viscosity. There are no particular limitations on solvents that can be used, and preferable examples thereof include hydrocarbon solvents, ether solvents, ketone solvents, glycol solvents, and halogenated solvents.

Specific examples of the hydrocarbon solvents include benzene, toluene, hexane and heptane. Specific examples of the ether solvents include tetrahydrofuran, 1,4-dioxane, 1,3-dioxolane and diethyl ether.

Specific examples of the ketone solvents include acetone, methyl ethyl ketone, methyl isobutyl ketone and cyclohexanone. Specific examples of the glycol solvents include propylene glycol-1-monomethyl ether-2-acetate (PGMEA) and ethylene glycol diethyl ether. Specific examples of the halogenated solvents include chloroform, methylene chloride and 1,2-dichloroethane.

Toluene, tetrahydrofuran, 1,3-dioxolane, propylene glycol-1-monomethyl ether-2-acetate and chloroform are preferable solvents.

Although the amount of solvent used can be appropriately set, the preferable lower limit of the amount of solvent used is 0.1 mL relative to 1 g of the curable composition used, while the preferable upper limit of the amount of solvent used is 10 mL. If the amount used is excessively low, the effects of the solvent such as reduction in viscosity are difficult to obtain, while if the amount used is excessively high, thermal cracking and the like due to solvent remaining in the material tend to become a problem, and there is also a disadvantage in terms of cost, thereby lowering the utility value in industry.

The solvent may be used as a single species or two or more species thereof can be used in admixture.

(Other Additives)

Other additives such as colorants, mold release agents, flame retardants, flame retardant promoters, surfactants, antifoaming agents, emulsifiers, leveling agents, cissing inhibitors, ion trapping agents such as antimony-bismuth compounds, thixotropic agents, tackifiers, storage stability improvers, antiozonants, photostabilizers, thickeners, plasticizers, reactive diluents, antioxidants, thermal stabilizers, electrical conductivity-imparting agents, antistatic agents, radiation blockers, nucleating agents, phosphorus-based peroxide decomposers, lubricants, pigments, metal deactivators, thermal conductivity-imparting agents and property modifiers may be added in the curable composition of the present invention as long as they do not impair the objects and effects of the present invention.

(Applications)

The curable composition or the cured product of the present invention can be used in various applications. It can be applied in various applications in which conventional acrylic or epoxy resin adhesives are used.

For example, the present invention can be applied to transparent materials, optical materials, optical lenses, optical films, optical sheets, adhesives for optical components, optical adhesives for optical waveguide coupling, adhesives for fixing members surrounding optical waveguides, adhesives for DVD lamination, pressure-sensitive adhesives, dicing tape, electronic materials, insulating materials (including printed boards and wire coverings), high-voltage insulating materials, interlayer insulators, TFT passivation layers, TFT gate insulators, TFT interlayer insulators, TFT transparent planarization films, insulating packings, insulating covering materials, adhesives, highly heat-resistant adhesives, high heat-radiation adhesives, optical adhesives, LED element adhesives, adhesives for various substrates, heat sink adhesives, coatings, UV powder coatings, inks, colored inks, UV inkjet inks, coating materials (including hard coatings, sheets, films, release paper coatings, optical disc coatings and optical fiber coatings), molded materials (including sheets, films and FRP), sealing materials, potting materials, encapsulants, encapsulants for light-emitting diodes, optical semiconductor encapsulants, liquid crystal sealants, display device sealants, electrical material encapsulants, encapsulants for various solar cells, heat-resistant sealing materials, resist materials; liquid resist materials, colored resists, dry film resist materials, solder resist materials, color filter binder resins, transparent planarization materials for color filters, black matrix binder resins, photo spacer materials for liquid crystal cells, transparent encapsulants for OLED elements, stereo lithography, solar cell materials, fuel cell materials, display materials, recording materials, vibration damping materials, waterproof materials, moisture-resistant materials, heat shrinkable rubber tubes, O-rings, copier photosensitive drums, battery solid electrolytes, and gas separation films. In addition, other examples of applications include concrete protective materials, linings, soil injection agents, cold heat storage materials, sealing materials for disinfection devices, contact lenses, oxygen-permeable films, and additives for other resins and the like.

In particular, the curable composition of the present invention is a material that can be preferably used as an alkali-developable transparent resist, and is particularly preferable as an FPD material. Specific examples of such applications include TFT passivation layers, TFT gate insulators, TFT interlayer insulators, TFT transparent planarization films, color filter binder resins, transparent planarization materials for color filters, black matrix binder resins, photo spacer materials for liquid crystal cells, and transparent encapsulants for OLED elements.

EXAMPLES

Although the following indicates examples and comparative examples of the present invention, the present invention is not limited thereto.

Examples 1 to 6 and Comparative Examples 1 and 2

Each of curable compositions obtained from Examples 1 to 6 and Comparative Examples 1 and 2 was evaluated by the following methods. Table 1 shows the results.

Cured products obtained by curing the curable compositions of the present invention serve as photocured materials having insulating properties superior to those of the compositions of comparative examples.

(Evaluation of Insulating Properties)

Samples for evaluating insulating properties were prepared in the manner described below using the resin compositions obtained from the examples and comparative examples. After spin-coating (rotating speed: 2000 rpm, 30 seconds) of the resin composition onto an SUS plate of which the surface had been polished with #400 paper, the coated resin composition was exposed to a cumulative amount of light of 200 mJ/cm$^2$ with a conveyor-type exposure apparatus (high-pressure mercury lamp, LH6 from Fusion UV Systems). Subsequently, a thin film was formed by heating for 1 hour on a hot plate heated to 150° C. Moreover, an Al electrode (6 mmφ) was formed on the thin film by sputtering.

Insulating properties were evaluated using a semiconductor parameter measuring system (Model 4156C, Agilent) by applying a voltage of 0 to 50 V in 0.5 V increments between electrodes (SUS-Al) placed on both sides of an insulator, and measuring the amount of leakage current per unit electrode surface area when applying a voltage of 30 V.

(Measurement of Film Thickness)

After forming a thin film on an SUS plate, the film thickness was calculated by measuring the UV-vis spectrum. Since thin films produced from the resin compositions of the present invention have excellent insulating properties, they can be applied as thin-film insulating materials that can be formed by solution coating.

(Alkali Developability)

Each of the curable compositions obtained from Examples 1 to 6 and Comparative Examples 1 and 2 was coated onto a glass plate to a thickness of about 50 μm followed by allowing the solvents to dry in air, immersing the residue in an alkaline developing solution (2.38% TMAH (tetramethylammonium hydroxide) aqueous solution) for 60 seconds, rinsing it with water, and evaluating the alkali developability based on the presence or absence of residual resin at the portion immersed in the developing solution. The presence was evaluated as "poor", and the absence was evaluated as "excellent".

Example 1

100 g of toluene and 57.49 g of 1,3,5,7-tetramethylcyclotetrasiloxane were placed in a 500 mL four-mouth flask followed by replacing the gas phase with nitrogen, and heating and stirring at an internal temperature of 105° C. A mixed liquid of 10.0 g of diallyl isocyanurate, 70.0 g of 1,4-dioxane and 0.0186 g of a xylene solution of platinum-vinylsiloxane complex (containing 3% by weight of platinum) was added dropwise over the course of 30 minutes. Six hours after completion of dropping, the degree of reaction of allyl groups was confirmed to be 95% or more by $^1$H-NMR and the reaction was terminated by cooling. Unreacted 1,3,5,7-tetramethylcyclotetrasiloxane and toluene were distilled off under reduced pressure to obtain a colorless, clear liquid referred to as "Reaction product A".

TABLE 1

| | Example 1 | Example 2 | Example 3 | Example 4 | Example 5 | Example 6 | Comparative Example 1 | Comparative Example 2 |
|---|---|---|---|---|---|---|---|---|
| Amount of leakage current (nA/cm$^2$) | 3.5 | 3.0 | 5 | 10 | 5 | 6.5 | 50 | >100 |
| Film thickness (μm) | 0.5 | 0.5 | 0.5 | 0.5 | 0.5 | 0.5 | 0.5 | 0.5 |
| Alkali developability | Excellent | Excellent | Poor | Poor | Poor | Excellent | Poor | Poor |

20 g of toluene and 10 g of "Reaction product A" were placed in a 100 mL four-mouth flask followed by replacing the gas phase with nitrogen, heating at an internal temperature of 105° C., adding a mixture of 3.0 g of vinylcyclohexene oxide and 3.0 g of toluene thereto, and confirming the degree of reaction of vinyl groups to be 95% or more by $^1$H-NMR 3 hours after addition. The reaction liquid was then cooled to obtain "Reaction product 1". In addition, as a result of $^1$H-NMR measurement, the "Reaction product 1" was confirmed to have an SiH group and an epoxy group which is a photopolymerizable functional group.

To 0.5 g of the obtained "Reaction product 1" were added 0.19 g of triallyl isocyanurate, 0.7 mg of a xylene solution of platinum-vinylsiloxane complex (containing 3% by weight of platinum), and 0.01 g of PI2074 (produced by Rhodia, photocationic polymerization initiator), and a 20% PGMEA solution of the resulting mixture was prepared.

Example 2

100 g of toluene and 57.49 g of 1,3,5,7-tetramethylcyclotetrasiloxane were placed in a 500 mL four-mouth flask followed by replacing the gas phase with nitrogen, and heating and stirring at an internal temperature of 105° C. A mixed liquid of 3.8 g of triallyl isocyanurate, 5.0 g of diallyl isocyanurate, 70.0 g of 1,4-dioxane and 0.0186 g of a xylene solution of platinum-vinylsiloxane complex (containing 3% by weight of platinum) was added dropwise over the course of 30 minutes. Six hours after completion of dropping, the degree of reaction of allyl groups was confirmed to be 95% or more by $^1$H-NMR and the reaction was terminated by cooling. Unreacted 1,3,5,7-tetramethylcyclotetrasiloxane and toluene were distilled off under reduced pressure to obtain a colorless, clear liquid referred to as "Reaction product B".

20 g of toluene and 10 g of "Reaction product B" were placed in a 100 mL four-mouth flask followed by replacing the gas phase with nitrogen, heating at an internal temperature of 105° C., adding a mixture of 3.0 g of vinylcyclohexene oxide and 3.0 g of toluene thereto, and confirming the degree of reaction of vinyl groups to be 95% or more by $^1$H-NMR 3 hours after addition. The reaction liquid was then cooled to obtain "Reaction product 2". In addition, as a result of $^1$H-NMR measurement, the "Reaction product 2" was confirmed to have an SiH group and an epoxy group which is a photopolymerizable functional group.

To 0.5 g of the obtained "Reaction product 2" were added 0.19 g of triallyl isocyanurate, 0.7 mg of a xylene solution of platinum-vinylsiloxane complex (containing 3% by weight of platinum), and 0.01 g of PI2074 (produced by Rhodia, photocationic polymerization initiator), and a 20% PGMEA solution of the resulting mixture was prepared.

Example 3

100 g of toluene and 57.49 g of 1,3,5,7-tetramethylcyclotetrasiloxane were placed in a 500 mL four-mouth flask followed by replacing the gas phase with nitrogen, and heating and stirring at an internal temperature of 105° C. A mixed liquid of 10.0 g of vinyl norbornene, 70.0 g of toluene and 0.0186 g of a xylene solution of platinum-vinylsiloxane complex (containing 3% by weight of platinum) was added dropwise over the course of 30 minutes. Six hours after completion of dropping, the degree of reaction of vinyl groups was confirmed to be 95% or more by $^1$H-NMR and the reaction was terminated by cooling. Unreacted 1,3,5,7-tetramethylcyclotetrasiloxane and toluene were distilled off under reduced pressure to obtain a colorless, clear liquid referred to as "Reaction product C".

20 g of toluene and 10 g of "Reaction product C" were placed in a 100 mL four-mouth flask followed by replacing the gas phase with nitrogen, heating at an internal temperature of 105° C., adding a mixture of 3.0 g of vinylcyclohexene oxide and 3.0 g of toluene thereto, and confirming the degree of reaction of vinyl groups to be 95% or more by $^1$H-NMR 3 hours after addition. The reaction liquid was then cooled to obtain "Reaction product 3". In addition, as a result of $^1$H-NMR measurement, the "Reaction product 3" was confirmed to have an SiH group and an epoxy group which is a photopolymerizable functional group.

To 0.5 g of the obtained "Reaction product 3" were added 0.14 g of vinyl norbornene, 0.7 mg of a xylene solution of platinum-vinylsiloxane complex (containing 3% by weight of platinum), and 0.01 g of PI2074 (produced by Rhodia, photacationic polymerization initiator), and a 20% MIBK solution of the resulting mixture was prepared.

Example 4

100 g of toluene and 57.49 g of 1,3,5,7-tetramethylcyclotetrasiloxane were placed in a 500 mL four-mouth flask followed by replacing the gas phase with nitrogen, and heating and stirring at an internal temperature of 105° C. A mixed liquid of 5.6 g of triallyl isocyanurate, 10.0 g of toluene and 62 mg of a xylene solution of platinum-vinylsiloxane complex (containing 3% by weight of platinum) was added dropwise. After completion of dropping, peaks derived from allyl groups were confirmed to disappear by $^1$H-NMR. Then, the reaction liquid was cooled and volatilized to obtain a colorless, clear liquid referred to as "Reaction product D".

20 g of toluene and 10 g of "Reaction product D" were placed in a 100 mL four-mouth flask followed by replacing the gas phase with nitrogen, heating at an internal temperature of 105° C., adding a mixture of 3.6 g of vinylcyclohexene oxide and 3.6 g of toluene thereto, and confirming the degree of reaction of vinyl groups to be 95% or more by $^1$H-NMR 3 hours after addition. The reaction liquid was then cooled to obtain "Reaction product 4". In addition, as a result of $^1$H-NMR measurement, the "Reaction product 4" was confirmed to have an SiH group and an epoxy group which is a photopolymerizable functional group.

To 0.5 g of the obtained "Reaction product 4" were added 0.20 g of triallyl isocyanurate, 0.7 mg of a xylene solution of platinum-vinylsiloxane complex (containing 3% by weight of platinum), and 0.01 g of PI2074 (produced by Rhodia, photocationic polymerization initiator), and a 20% MIBK solution of the resulting mixture was prepared.

Example 5

100 g of toluene and 57.49 g of 1,3,5,7-tetramethylcyclotetrasiloxane were placed in a 500 mL four-mouth flask followed by replacing the gas phase with nitrogen, and heating and stirring at an internal temperature of 105° C. A mixed liquid of 7.5 g of 1,3,5,7-vinyl-1,3,5,7-tetramethylcyclotetrasiloxane, 70.0 g of toluene and 0.0186 g of a xylene solution of platinum-vinylsiloxane complex (containing 3% by weight of platinum) was added dropwise. After completion of dropping, peaks derived from vinyl groups were confirmed to disappear by $^1$H-NMR. Then, the reaction liquid was cooled and volatilized to obtain a colorless, clear liquid referred to as "Reaction product E".

20 g of toluene and 10 g of "Reaction product E" were placed in a 100 mL four-mouth flask followed by replacing the gas phase with nitrogen, heating at an internal temperature of 105° C., adding a mixture of 3.0 g of vinylcyclohexene oxide and 3.0 g of toluene thereto, and confirming the degree of reaction of vinyl groups to be 95% or more by $^1$H-NMR 3 hours after addition. The reaction liquid was then cooled to obtain "Reaction product 5". In addition, as a result of $^1$H-NMR measurement, the "Reaction product 5" was confirmed to have an SiH group and an epoxy group which is a photopolymerizable functional group.

To 0.5 g of the obtained "Reaction product 5" were added 0.65 g of MQV7 (produced by Clariant (Japan) K.K., siloxane compound having Si—CH=CH$_2$ group), 0.7 mg of a xylene solution of platinum-vinylsiloxane complex (containing 3% by weight of platinum), and 0.01 g of PI2074 (produced by Rhodia, photocationic polymerization initiator), and a 20% MIBK solution of the resulting mixture was prepared.

Example 6

100 g of toluene and 57.49 g of 1,3,5,7-tetramethylcyclotetrasiloxane were placed in a 500 mL four-mouth flask followed by replacing the gas phase with nitrogen, and heating and stirring at an internal temperature of 105° C. A mixed liquid of 10.0 g of diallyl isocyanurate, 70.0 g of 1,4-dioxane and 0.0186 g of a xylene solution of platinum-vinylsiloxane complex (containing 3% by weight of platinum) was added dropwise over the course of 30 minutes. Six hours after completion of dropping, the degree of reaction of allyl groups was confirmed to be 95% or more by $^1$H-NMR and the reaction was terminated by cooling. Unreacted 1,3,5,7-tetramethylcyclotetrasiloxane and toluene were distilled off under reduced pressure to obtain a colorless, clear liquid referred to as "Reaction product A".

20 g of toluene and 10 g of "Reaction product A" were placed in a 100 mL four-mouth flask followed by replacing the gas phase with nitrogen, heating at an internal temperature of 105° C., adding a mixture of 4.5 g of vinyltrimethoxysilane and 4.5 g of toluene thereto, and confirming the degree of reaction of vinyl groups to be 95% or more by $^1$H-NMR 3 hours after addition. The reaction liquid was then cooled to obtain "Reaction product 6". In addition, as a result of $^1$H-NMR measurement, the "Reaction product 6" was confirmed to have an SiH group and an alkoxysilyl group which is a photopolymerizable functional group.

To 0.5 g of the obtained "Reaction product 6" were added 0.19 g of triallyl isocyanurate, 0.7 mg of a xylene solution of platinum-vinylsiloxane complex (containing 3% by weight of platinum), and 0.01 g of PI2074 (produced by Rhodia, photocationic polymerization initiator), and a 20% PGMEA solution of the resulting mixture was prepared.

Comparative Example 1

15 g of toluene and 7.5 g of 1,3,5,7-tetramethylcyclotetrasiloxane were placed in a 100 mL four-mouth flask followed by replacing the gas phase with nitrogen, heating at an internal temperature of 105° C., adding 5.0 g of vinylcyclohexene oxide and stirring for 2 hours. The degree of reaction of vinyl groups was confirmed to be 95% or more by $^1$H-NMR 2 hours after addition. The reaction liquid was then cooled to obtain "Comparative Reaction product 1".

To 0.5 g of the obtained "Comparative Reaction product 1" was added 0.01 g of PI2074 (produced by Rhodia, photocationic polymerization initiator), and a 20% PGMEA solution of the resulting mixture was prepared.

Comparative Example 2

0.015 g of Irgacure184 (produced by Ciba Speciality Chemicals, photoradical initiator) was added to 0.5 g of ditrimethylolpropane tetraacrylate (produced by Shin-Nakamura Chemical Co., Ltd., DA-TMP), and a 20% PGMEA solution of the resulting mixture was prepared.

The invention claimed is:

1. A photocurable composition comprising:
(A) a modified polyorganosiloxane compound having a photopolymerizable functional group and an SiH group;
(B) a compound having a carbon-carbon double bond; and
(C) a photopolymerization initiator,
wherein the component (A) is a hydrosilylation reaction product of the following compounds (α) to (γ):
(α) an organic compound having, in a molecule thereof, one or more carbon-carbon double bonds that have reactivity with SiH groups;
(β) an organosiloxane compound having at least two SiH groups in a molecule thereof; and
(γ) a compound having, in a molecule thereof, a photopolymerizable functional group and a carbon-carbon double bond that has reactivity with SiH groups,
and wherein the compound (β) is at least one species selected from the group consisting of organopolysiloxanes having at least two SiH groups in a molecule thereof and having a T or Q structure in the molecule and represented by the following formulas:

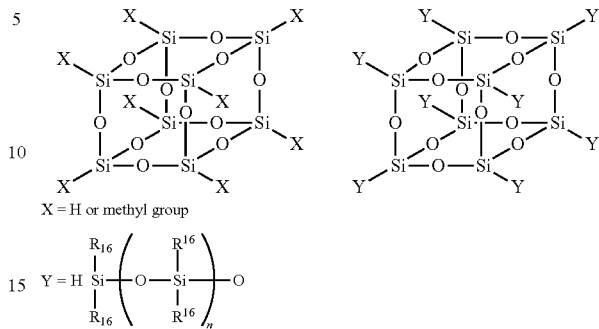

X = H or methyl group

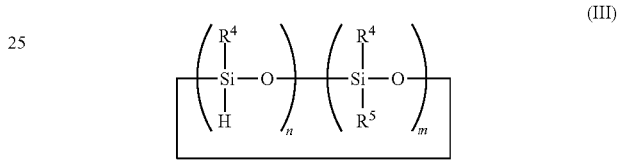

(wherein $R^{16}$ represents a $C_{1-6}$ organic group and n represents a number of 0 to 50) and organosiloxanes represented by the following general formula (III):

$$\left[ \left( \begin{array}{c} R^4 \\ | \\ Si-O \\ | \\ H \end{array} \right)_n \left( \begin{array}{c} R^4 \\ | \\ Si-O \\ | \\ R^5 \end{array} \right)_m \right] \quad (III)$$

wherein $R^4$ and $R^5$ each represents a $C_{1-6}$ organic group, and may be the same or different, n represents a number of 2 to 10, m represents a number of 0 to 10, and "n+m" represents a number of 3 or more.

2. The curable composition according to claim 1, wherein the photopolymerizable functional group in the component (A) is at least one member selected from the group consisting of an epoxy group, a crosslinkable silicon group, a (meth)acryloyl group, and an oxetanyl group.

3. The curable composition according to claim 1, wherein at least one of the photopolymerizable functional group in the component (A) is an alicyclic epoxy group or a glycidyl group.

4. The curable composition according to claim 1, wherein at least one of the photopolymerizable functional group in the component (A) is an alkoxysilyl group.

5. The curable composition according to claim 1, wherein the component (B) is a compound represented by the following general formula (I):

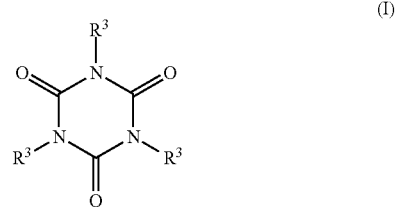

wherein, $R^3$s each represent a $C_{1-50}$ monovalent organic group, and may be the same as or different from each other, and at least one $R^3$ contains a carbon-carbon double bond having reactivity with SiH groups.

6. The curable composition according to claim 1, wherein the component (B) is a compound having an Si—CH=CH$_2$ group.

7. The curable composition according to claim 1, wherein the component (A) is a modified polyorganosiloxane compound having a photopolymerizable functional group, an SiH group, and at least one member selected from the group consisting of moieties represented by the following formulas (X1) to (X3), a phenolic hydroxyl group, and a carboxyl group:

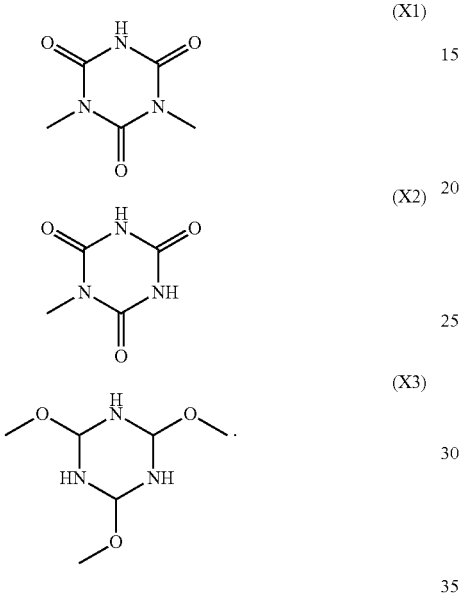

8. The curable composition according to claim 1, wherein the compound (α) is a compound having one or more carbon-carbon double bonds that have reactivity with SiH groups, and represented by the following general formula (I):

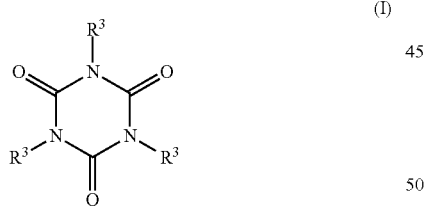

wherein, R$^3$s each represent a C$_{1-50}$ monovalent organic group, and may be the same as or different from each other, and at least one R$^3$ contains a carbon-carbon double bond having reactivity with SiH groups.

9. The curable composition according to claim 1, wherein the compound (α) is a compound having an Si—CH=CH$_2$ group.

10. The curable composition according to claim 1, wherein the compound (α) is an organic compound that has, in a molecule thereof, one or more carbon-carbon double bonds having reactivity with SiH groups, and has, within the same molecule, at least one member selected from the group consisting of moieties represented by the following formulas (X1) to (X3), a phenolic hydroxyl group, and a carboxyl group:

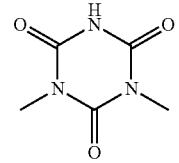

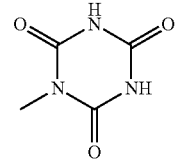

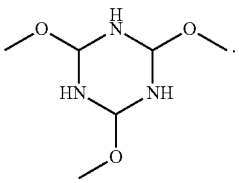

11. The curable composition according to claim 1, wherein the compound (β) is a cyclic polyorganosiloxane compound having SiH groups, represented by the following general formula (III):

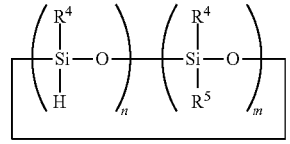

wherein, R$^4$ and R$^5$ each represents a C$_{1-6}$ organic group and may be the same or different, n represents a number of 2 to 10, m represents a number of 0 to 10, and "n+m" represents a number of 3 or more.

12. The curable composition according to claim 1, wherein the compound (γ) is a compound represented by the following general formula (IV):

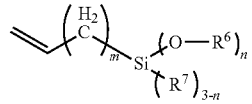

wherein, R$^6$ and R$^7$ each represent a C$_{1-6}$ organic group, n represents a number of 1 to 3, and m represents a number of 0 to 10.

13. A cured product obtained by curing the curable composition according to claim 1.

14. The curable composition according to claim 1, wherein the compound (β) is at least one species selected from the group consisting of organopolysiloxanes having at least two SiH groups in a molecule thereof and having a T or Q structure in the molecule and represented by the following formulas:

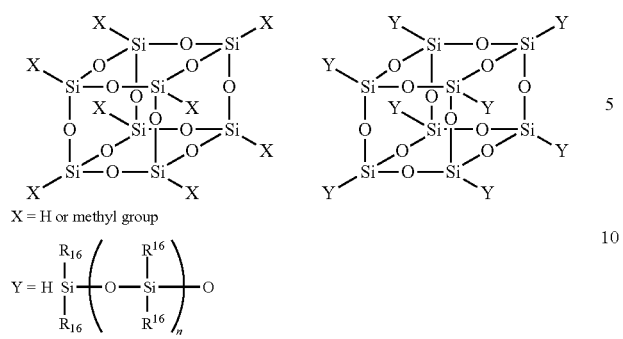
X = H or methyl group
Y = H $\underset{R_{16}}{\overset{R_{16}}{\underset{|}{\overset{|}{Si}}}}$ $\left( O - \underset{R^{16}}{\overset{R^{16}}{\underset{|}{\overset{|}{Si}}}} \right)_n$ O
(wherein $R^{16}$ represents a $C_{1-6}$ organic group and n represents a number of 0 to 50).
* * * * *